United States Patent
Kinoshita et al.

(10) Patent No.: US 9,793,392 B2
(45) Date of Patent: Oct. 17, 2017

(54) SEMICONDUCTOR DEVICE

(71) Applicant: FUJI ELECTRIC CO., LTD., Kawasaki-shi, Kanagawa (JP)

(72) Inventors: Akimasa Kinoshita, Matsumoto (JP); Masahito Otsuki, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/581,021

(22) Filed: Apr. 28, 2017

(65) Prior Publication Data
US 2017/0229573 A1 Aug. 10, 2017

Related U.S. Application Data

(63) Continuation of application No. PCT/JP2015/085148, filed on Dec. 16, 2015.

(30) Foreign Application Priority Data

Dec. 25, 2014 (JP) ................................. 2014-263020

(51) Int. Cl.
*H01L 29/15* (2006.01)
*H01L 31/0312* (2006.01)
(Continued)

(52) U.S. Cl.
CPC ........ *H01L 29/7811* (2013.01); *H01L 21/046* (2013.01); *H01L 21/761* (2013.01);
(Continued)

(58) Field of Classification Search
CPC ............. H01L 29/7397; H01L 29/1095; H01L 29/66348; H01L 29/7813; H01L 29/0619;
(Continued)

(56) References Cited

U.S. PATENT DOCUMENTS

2001/0050383 A1* 12/2001 Hatade ................ H01L 29/0696
257/262
2002/0175351 A1* 11/2002 Baliga ................. H01L 29/0878
257/242
(Continued)

FOREIGN PATENT DOCUMENTS

| JP | 2006-147789 A | 6/2006 |
|----|---------------|--------|
| JP | 2008-098536 A | 4/2008 |
| JP | 2010-045388 A | 2/2010 |
| JP | 2013-232564 A | 11/2013 |

OTHER PUBLICATIONS

K. Shenai et al., "Optimum Semiconductors for High-Power Electronics", IEEE Transactions on Electron Devices, vol. 36, No. 9, pp. 1811-1823, Sep. 1989.
B. Jayant Baliga, "Silicon Carbide Power Devices", U.S.A, World Scientific Publishing Co., pp. 60-63, Mar. 30, 2006.

*Primary Examiner* — Zandra Smith
*Assistant Examiner* — John M Parker
(74) *Attorney, Agent, or Firm* — Rabin & Berdo, P.C.

(57) ABSTRACT

A MOS gate structure is provided on a p-type base layer side of a silicon carbide semiconductor base formed by sequentially forming on a front surface of an $n^+$-type silicon carbide substrate, an n-type drift layer and a p-type base layer by epitaxial growth. On the base front surface, in an edge termination structure region, a step portion occurring between the p-type base layer and the n-type drift layer, and a flat portion farther outward than the step portion are provided. In a surface layer of the n-type drift layer, a $p^+$-type base region constituting the MOS gate structure is provided so as to contact the p-type base layer. The outermost $p^+$-type base region extends from an active region into the flat portion and the entire lower side of this portion is covered by an innermost $p^-$-type region constituting an edge termination structure provided in the flat portion.

12 Claims, 16 Drawing Sheets

(51) Int. Cl.
*H01L 29/78* (2006.01)
*H01L 29/16* (2006.01)
*H01L 29/10* (2006.01)
*H01L 29/06* (2006.01)
*H01L 29/66* (2006.01)
*H01L 21/04* (2006.01)
*H01L 21/761* (2006.01)

(52) U.S. Cl.
CPC ...... *H01L 29/0623* (2013.01); *H01L 29/1095* (2013.01); *H01L 29/1608* (2013.01); *H01L 29/66068* (2013.01); *H01L 29/7813* (2013.01)

(58) Field of Classification Search
CPC ............... H01L 29/0696; H01L 29/407; H01L 29/4236
See application file for complete search history.

(56) References Cited

U.S. PATENT DOCUMENTS

| | | | |
|---|---|---|---|
| 2005/0161761 A1* | 7/2005 | Hatade | H01L 27/088 257/487 |
| 2009/0134402 A1 | 5/2009 | Yatsuo et al. | |
| 2009/0173949 A1* | 7/2009 | Yatsuo | H01L 21/8213 257/77 |
| 2010/0012951 A1 | 1/2010 | Yatsuo et al. | |
| 2010/0219417 A1 | 9/2010 | Miura et al. | |
| 2015/0115285 A1 | 4/2015 | Kinoshita et al. | |

* cited by examiner

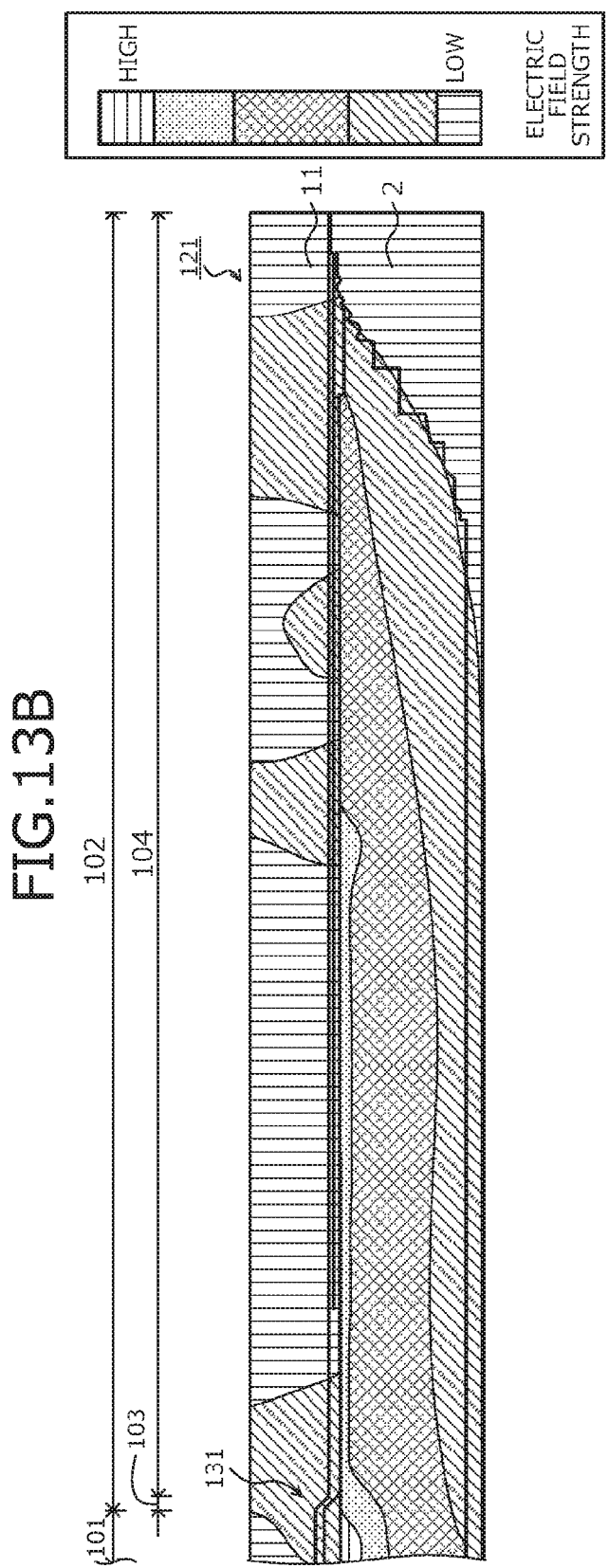

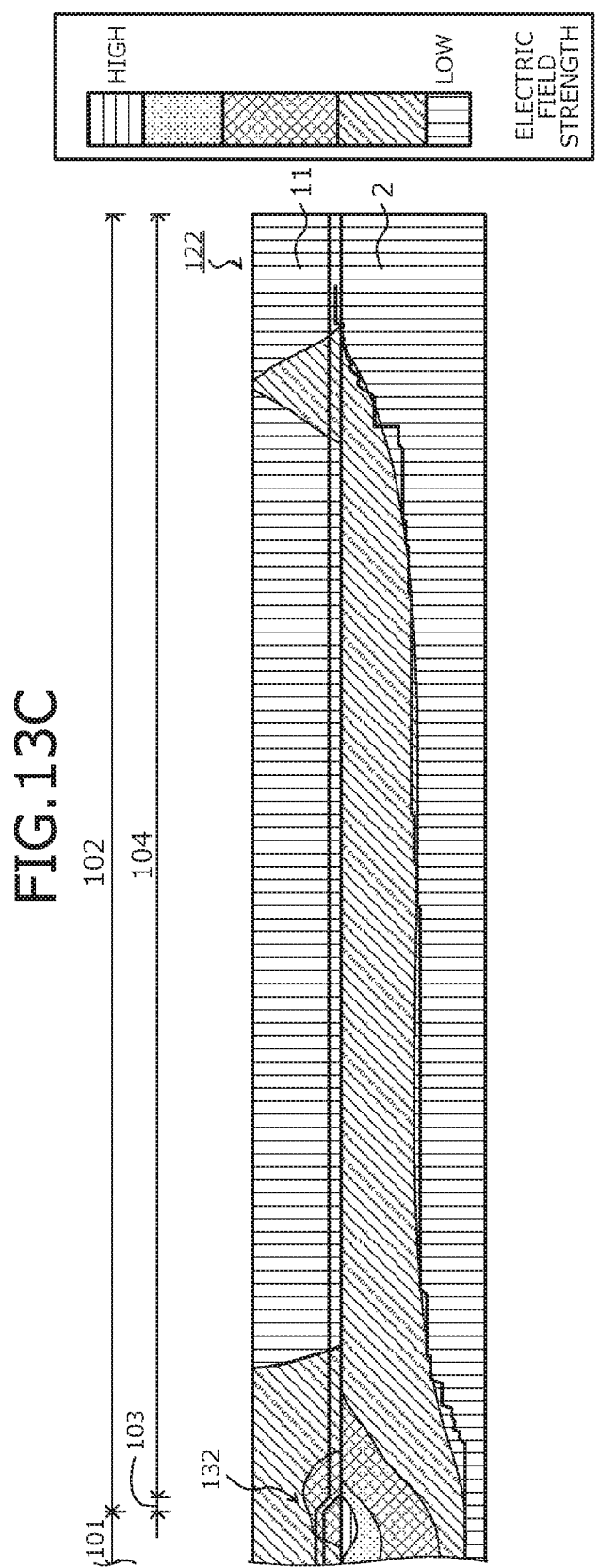

SEMICONDUCTOR DEVICE

CROSS REFERENCE TO RELATED APPLICATIONS

This is a continuation application of International Application PCT/JP2015/085148 filed on Dec. 16, 2015 which claims priority from a Japanese Patent Application No. 2014-263020 filed on Dec. 25, 2014, the contents of which are incorporated herein by reference.

BACKGROUND OF THE INVENTION

1. Field of the Invention

Embodiments of the invention relate to a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

However, there has been a strong demand in the market for a power semiconductor device that achieves both large current and high speed. Thus, IGBTs and power MOSFETs have been intensively developed and improved, and the performance of power devices has substantially reached the theoretical limit determined by the material. In terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pages 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other wide bandgap semiconductors (hereinafter, wide bandgap semiconductor) having a bandgap greater than silicon, such as gallium nitride (GaN). Thus, a high-voltage semiconductor device having low resistance can be achieved by using a wide bandgap semiconductor (see, for example, B. Jayant Baliga, "Silicon Carbide Power Devices", U.S.A, World Scientific Publishing Co., Mar. 30, 2006, page 61).

Further, as another semiconductor device realizing low resistance and high voltage, a device that raises the crystalline quality of a portion in which a channel is formed, by forming the portion (base portion) that becomes the channel (inversion layer) by epitaxial growth has been proposed (for example, refer to Japanese Laid-Open Patent Publication No. 2006-147789). In Japanese Laid-Open Patent Publication No. 2006-147789, by raising the crystalline property of the portion in which the channel is formed and reducing the channel resistance, lower resistance and higher voltage are realized.

As a semiconductor device in which a portion becoming a channel is formed by epitaxial growth, a device has been proposed in which a portion of an edge termination structure portion of the epitaxial layer that includes the portion becoming a channel is removed whereby a p-type region is provided at a step portion occurring near a boundary of the active region and the edge termination structure portion and, at the step portion, the distribution of a p-type impurity in a depth direction is gentle, the device mitigates the concentration of electric field at the step portion and prevents a reduction of the breakdown voltage (for example, refer to Japanese Laid-Open Patent Publication No. 2010-045388).

SUMMARY OF THE INVENTION

According to one aspect of the present invention, a semiconductor device has an active region through which current flows and an edge termination structure portion in which an edge termination structure is formed, the edge termination structure portion being arranged outside the active region. The semiconductor device includes a first semiconductor layer of a first conductivity type, provided on a front surface of a semiconductor substrate of the first conductivity type, the first semiconductor layer having an impurity concentration that is lower than that of the semiconductor substrate; a first semiconductor region of a second conductivity type, selectively provided in a surface layer on a first side of the first semiconductor layer opposite from a second side of the first semiconductor layer, the second side facing the semiconductor substrate; a second semiconductor layer of the second conductivity type and having an impurity concentration that is lower than that of the first semiconductor region, the second semiconductor layer being provided on a surface of the first side of the first semiconductor layer, so as to cover the first semiconductor region; and a second semiconductor region of the second conductivity type and having an impurity concentration that is lower than that of the first semiconductor region, the second semiconductor region constituting the edge termination structure and selectively provided farther outside than the first semiconductor region, in the surface layer on the first side of the first semiconductor layer. In the edge termination structure portion, a step portion between the second semiconductor layer and the first semiconductor layer, and a flat portion where the surface of the first semiconductor layer is exposed farther outside than the step portion are provided. The first semiconductor region that is outermost extends from the active region into the flat portion. The second semiconductor region is provided in the flat portion and entirely covers the semiconductor substrate side of a portion of the first semiconductor region, the portion extending into the flat portion.

In the semiconductor device, the second semiconductor region is provided so as to overlap the step portion and the portion of the first semiconductor region extending into the flat portion.

In the semiconductor device, the second semiconductor region is provided so as to extend to the second semiconductor layer and overlap an outer circumferential portion of the second semiconductor layer.

The semiconductor device includes a third semiconductor region of the first conductivity type, selectively provided in the second semiconductor layer; a fourth semiconductor region of the first conductivity type, provided away from the third semiconductor region, the fourth semiconductor region penetrating the second semiconductor layer in a depth direction and reaching the first semiconductor layer; a gate electrode provided on a surface of a region of the second semiconductor layer between the third semiconductor region and the fourth semiconductor region, via a gate insulating film; a first electrode contacting the second semiconductor layer and the third semiconductor region; and a second electrode provided on a rear surface of the semiconductor substrate.

The semiconductor device includes a third semiconductor region of the first conductivity type, selectively provided in the second semiconductor layer; a trench penetrating the third semiconductor region, the second semiconductor layer, and the first semiconductor region, or a portion of first semiconductor region, and reaching the first semiconductor layer; a gate electrode provided in the trench, via a gate insulating film; a first electrode contacting the second semiconductor layer and the third semiconductor region; and a second electrode provided on a rear surface of the semiconductor substrate.

The semiconductor device includes a fifth semiconductor region of the second conductivity type, selectively provided in the second semiconductor layer. The fifth semiconductor region that is outermost extends to the second semiconductor region and contacts the second semiconductor region.

In the semiconductor device, the fifth semiconductor region that is outermost is provided so as to overlap an inner circumferential portion of the second semiconductor region.

According to another aspect of the present invention, a semiconductor device has an active region through which current flows and an edge termination structure portion (edge termination structure region) in which a structure for reducing concentration of electric field is formed, the edge termination structure portion being arranged outside the active region. The semiconductor device includes a first semiconductor layer of a first conductivity type, provided on a front surface of a semiconductor substrate of the first conductivity type, the first semiconductor layer having an impurity concentration that is lower than that of the semiconductor substrate; a first semiconductor region of a second conductivity type, selectively provided in a surface layer on a first side of the first semiconductor layer opposite from a second side of the first semiconductor layer, the second side facing the semiconductor substrate; a second semiconductor layer of the second conductivity type and having an impurity concentration that is lower than that of the first semiconductor region, the second semiconductor layer being provided on a surface of the first side of the first semiconductor layer, so as to cover the first semiconductor region; a second semiconductor region of the second conductivity type and having an impurity concentration that is lower than that of the first semiconductor region, the second semiconductor region constituting the edge termination structure and selectively provided farther outside than the first semiconductor region, in the surface layer on the first side of the first semiconductor layer; a third semiconductor region of the first conductivity type, selectively provided in the second semiconductor layer; a fifth semiconductor region of the second conductivity type, selectively provided in the second semiconductor layer; a gate insulating film provided contacting a region of the second semiconductor layer between the third semiconductor region and the first semiconductor layer; a gate electrode provided sandwiching the gate insulating film with the second semiconductor layer on an opposite side; a first electrode contacting the second semiconductor layer and the third semiconductor region; and a second electrode provided on a rear surface of the semiconductor substrate. In the edge termination structure portion, a step portion between the second semiconductor layer and the first semiconductor layer, and a flat portion where the surface of the first semiconductor layer is exposed farther outside than the step portion are provided. The first semiconductor region that is outermost extends from the active region into the flat portion. The fifth semiconductor region that is outermost extends into the flat portion and entirely covers the semiconductor substrate side of a portion of the first semiconductor region, the portion extending into the flat portion.

In the semiconductor device, a surface on a first side of the second semiconductor region opposite from a second side thereof facing toward the semiconductor substrate is positioned closer to the semiconductor substrate than a surface on a first side of the second semiconductor layer opposite from a second side thereof facing toward the semiconductor substrate is.

In the semiconductor device, an interface of the second semiconductor region and the first semiconductor layer is positioned closer to the semiconductor substrate than an interface of the first semiconductor region and the first semiconductor layer is.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 13A, 13B, and 13C are characteristics diagrams depicting electric field strength distribution near a boundary of an active region and an edge termination structure portion.

DETAILED DESCRIPTION OF THE INVENTION

Figure 1:
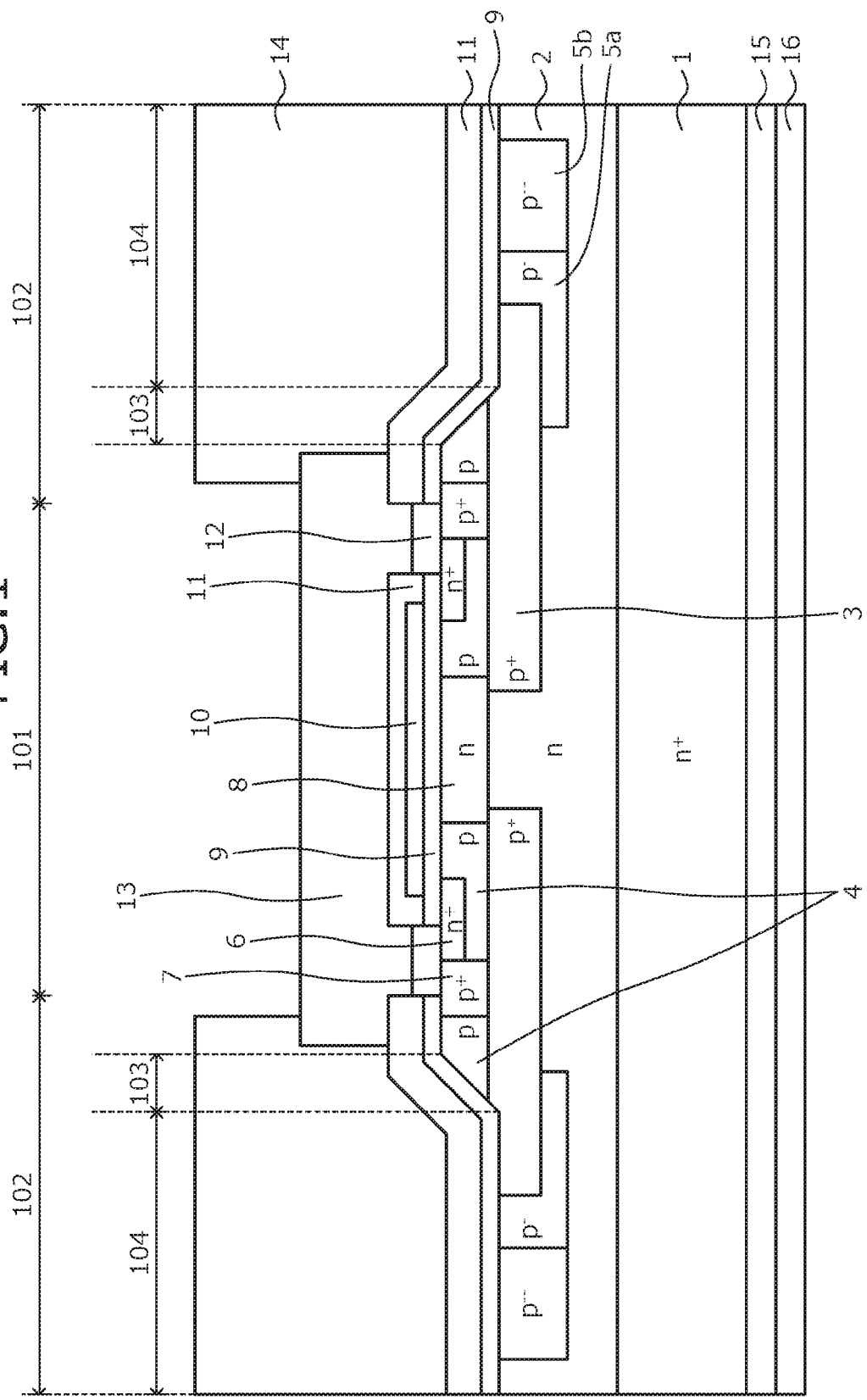
FIG. 1 is a cross-sectional view of a structure of a semiconductor device according to a first embodiment.

Embodiments of a semiconductor device according to the present invention will be described in detail with reference to the accompanying drawings. In the present description and accompanying drawings, layers and regions prefixed with n or p mean that majority carriers are electrons or holes.

Additionally, + or − appended to n or p means that the impurity concentration is higher or lower, respectively, than layers and regions without + or −, and represents one example. Depending on the structure that is optimal, the concentrations may be reversed. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A structure of the semiconductor device according to a first embodiment will be described taking, as an example, a vertical MOSFET having a planar gate structure that uses a silicon carbide (SiC) semiconductor. FIG. 1 is a cross-sectional view of the structure of the semiconductor device according to the first embodiment. The semiconductor device according to the first embodiment and depicted in FIG. 1 is manufactured (produced) using a silicon carbide semiconductor base (semiconductor chip) formed by sequentially depositing on a front surface of an $n^+$-type silicon carbide substrate 1 that becomes an $n^+$-type drain layer, a n-type silicon carbide epitaxial layer that becomes an n-type drift layer (first semiconductor layer) 2 and a p-type silicon carbide epitaxial layer that becomes a p-type base layer (second semiconductor layer) 4. On the silicon carbide semiconductor base, an active region 101 is provided near a center portion and an edge termination structure portion 102 is provided in an outer circumferential portion surrounding a periphery of the active region 101. The active region 101 is an area through which main current flows during an ON state. The edge termination structure portion 102 is a region that mitigates electric field on a base front surface side of the n-type drift layer 2 and sustains the breakdown voltage.

On a front surface side of the silicon carbide semiconductor base, the p-type silicon carbide epitaxial layer that becomes the p-type base layer 4 extends from the active region 101 to near a boundary of the active region 101 and the edge termination structure portion 102. In other words, on the front surface of the silicon carbide semiconductor base, near the boundary of the edge termination structure portion 102 with the active region 101, an outer circumferential portion of the p-type base layer 4 is removed whereby a step portion 103 occurring between the p-type base layer 4 and the n-type drift layer 2 is provided. A portion of the front surface of the silicon carbide semiconductor base, farther outward (chip edge portion side) than the step portion 103 is a flat portion 104 exposing a surface of the n-type drift layer 2. The base front surface (surface of a $p^-$-type region (second semiconductor region) 5a and a $p^{--}$-type region 5b described hereinafter) in the flat portion 104 is at a position that is deeper (closer to base rear surface) than a position of the base front surface in the active region 101 (surface of the p-type base layer 4).

In the active region 101, on a front surface side (the p-type base layer 4 side) of the silicon carbide semiconductor base, a metal oxide film semiconductor (MOS) insulated gate structure having a planar gate structure is provided. FIG. 1 depicts a single unit cell among one or more unit cells (element functional unit) arranged in the active region 101. In particular, in a surface layer on an opposite side of the n-type drift layer 2 (n-type silicon carbide epitaxial layer) from an $n^+$-type silicon carbide substrate 1 side, a $p^+$-type base region (first semiconductor region) 3 is selectively provided. The outermost $p^+$-type base region 3 that is farthest on an outer side (the edge termination structure portion 102 side) extends into the flat portion 104 of the edge termination structure portion 102 and is exposed at the base front surface in the flat portion 104 (i.e., a portion of the edge termination structure portion 102 where the p-type base layer 4 is not deposited). The $p^+$-type base region 3 together with the p-type base layer 4 constitutes a base region.

On the surface of the opposite side of the n-type drift layer 2 from the $n^+$-type silicon carbide substrate 1 side, the p-type base layer 4 (p-type silicon carbide epitaxial layer) is selectively deposited so as to cover portions of the $p^+$-type base region 3 other than a portion thereof extending into the flat portion 104 and to cover a portion of the n-type drift layer 2 between adjacent $p^+$-type base regions 3. The p-type base layer 4 has an impurity concentration that is lower than an impurity concentration of the $p^+$-type base region 3. Formation of the p-type base layer 4 by epitaxial growth enables the crystalline property of the portion in which a channel is formed to be raised whereby the channel resistance (i.e., ON resistance) may be lowered. An $n^+$-type source region (third semiconductor region) 6 and a $p^+$-type contact region (fifth semiconductor region) 7 are each selectively provided in a portion of the p-type base layer 4 on the $p^+$-type base region 3. The $n^+$-type source region 6 and the $p^+$-type contact region 7 contact each other. The $n^+$-type source region 6 is arranged at a position that is closer to an n-type well region (fourth semiconductor region) 8 described hereinafter than a position of the $p^+$-type contact region 7 is.

In the p-type base layer 4, the n-type well region 8 is provided, penetrating the p-type base layer 4 in a depth direction and reaching the n-type drift layer 2. The n-type well region 8 is a junction field effect transistor (JFET) region arranged between adjacent base regions and directly beneath (base side of) a gate electrode 10. The n-type well region 8 together with the n-type drift layer 2 constitutes a drift region. A gate electrode 10 is provided on a surface of the p-type base layer 4 between the $n^+$-type source region 6 and the n-type well region 8, via a gate insulating film 9. The gate electrode 10 may be provided on a surface of the n-type well region 8, via the gate insulating film 9. The gate insulating film 9 may be provided on the entire front surface side of the silicon carbide semiconductor base, excluding a portion requiring a contact electrode. Although not depicted, when multiple unit cells are arranged, the MOS gate structures of the unit cells are arranged in parallel.

An interlayer insulating film 11 is provided on the entire front surface side of the silicon carbide semiconductor base so as to cover the gate electrode 10. A source electrode (first electrode) 12 contacts the $n^+$-type source region 6 and the $p^+$-type contact region 7 via a contact hole that penetrates the interlayer insulating film 11 in the depth direction, and the source electrode 12 is electrically insulated from the gate electrode 10 by the interlayer insulating film 11. A front electrode pad 13 is provided across the active region 101 entirely so as to contact the source electrodes 12 of all of the unit cells. An end portion of the front electrode pad 13 extends onto the interlayer insulating film 11 of the edge termination structure portion 102 and, for example, terminates farther on an inner side (the active region 101 side) than the step portion 103. On the interlayer insulating film 11 in the edge termination structure portion 102, a protective film 14 such as, for example, a passivation film formed from polyimide is provided so as to cover the end portion of the front electrode pad 13 and an outer-side end portion of the source electrode 12 of the outermost unit cell farthest on the outer side. The protective film 14 has a function of preventing discharge.

Further, in the edge termination structure portion 102, in the surface layer on the opposite side of the n-type drift layer 2 from the n$^+$-type silicon carbide substrate 1 side, an edge termination structure constituted by multiple p-type regions of differing impurity concentrations (the p$^-$-type region 5a and the p$^{--}$-type region 5b) is provided. The edge termination structure has a function of mitigating electric field concentration near the boundary of the active region 101 and the edge termination structure portion 102. In particular, the p$^-$-type region 5a is provided so as to be exposed at the base front surface in the flat portion 104, to contact the outermost p$^+$-type base region 3, and to surround a periphery of this p$^+$-type base region 3. Further, the p$^-$-type region 5a extends from the flat portion 104 toward the inner side, for example, to the step portion 103, covering the entire lower side (drain side) of the portion of the outermost p$^+$-type base region 3 extending into the flat portion 104. The p$^{--}$-type region 5b is provided farther on the outer side than the p$^-$-type region 5a is, contacts the p$^-$-type region 5a, and surrounds a periphery of the p$^-$-type region 5a.

In other words, the p$^-$-type region 5a and the p$^{--}$-type region 5b are provided in a concentric shape surrounding the periphery of the active region 101 and constitute a double zone junction termination extension (JTE) structure. The interface of the n-type drift layer 2 with the p$^-$-type region 5a and the p$^{--}$-type region 5b is positioned farther on the drain side than the interface of the p$^+$-type base region 3 and the n-type drift layer 2 is. In other words, the p$^-$-type region 5a and the p$^{--}$-type region 5b have a thickness (a depth from the base front surface) that is thicker than a thickness of the p$^+$-type base region 3 in the flat portion 104. The base front surface in the edge termination structure portion 102 (including the step portion 103 and the flat portion 104) is covered by the interlayer insulating film 11 (or an insulating layer in which the gate insulating film 9 and the interlayer insulating film 11 are sequentially stacked). The p$^-$-type region 5a and the p$^{--}$-type region 5b are electrically insulated from the unit cells of the active region 101 by the interlayer insulating film 11.

In place of the double zone JTE structure, the edge termination structure arranged in the edge termination structure portion 102 may be another edge termination structure for mitigating electric field concentration such as a multizone JTE structure, a field limiting ring (FLR) structure, or the like. A multizone JTE structure is an edge termination structure in which 3 or more p-type regions of differing impurity concentrations are arranged in a concentric shape surrounding the periphery of the active region 101 and the impurity concentrations of the p-type regions are progressively lower the farther on the outer side the p-type region is arranged. A FLR structure is an edge termination structure in which multiple p-type regions are arranged at predetermined intervals in a concentric shape surrounding the periphery of the active region 101 and is applicable irrespective of the difficulty of manufacturing. On a rear surface of the silicon carbide semiconductor base (rear surface of the n$^+$-type silicon carbide substrate 1), a rear electrode (second electrode) 15 is provided that is a drain electrode and extends from the active region 101 across the edge termination structure portion 102. A rear electrode pad 16 is provided on a surface of the rear electrode 15.

Figure 2:
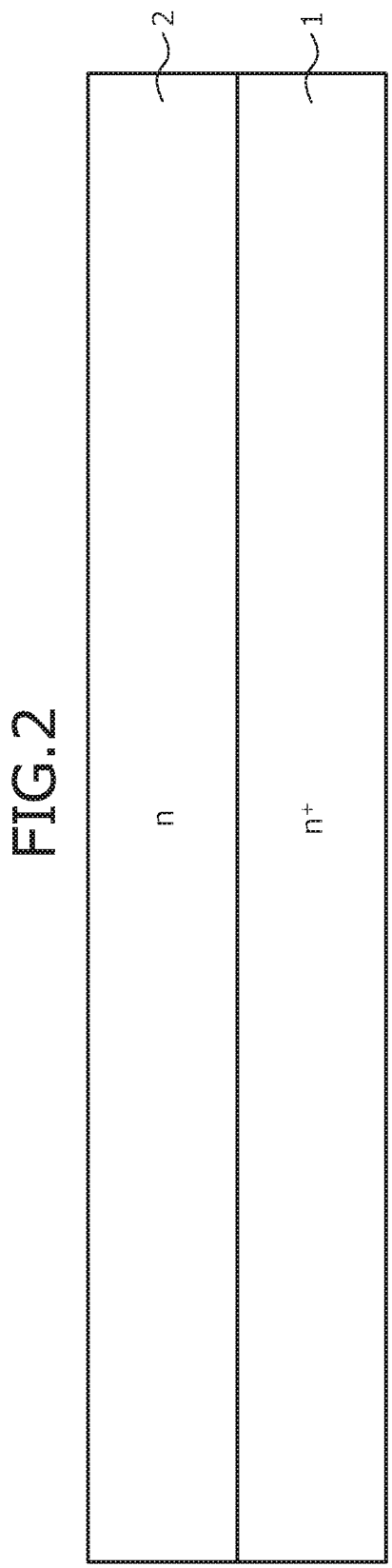
FIGS. 2, 3, 4, 5, 6, and 7 are cross-sectional views depicting states of the semiconductor device according to the first embodiment during manufacture.

A method of manufacturing the semiconductor device according to the first embodiment will be described taking, as an example, a case where, for example, a 1200V vertical MOSFET having a planar gate structure using a silicon carbide semiconductor is manufactured. FIGS. 2, 3, 4, 5, 6, and 7 are cross-sectional views depicting states of the semiconductor device according to the first embodiment during manufacture. First, as depicted in FIG. 2, the n$^+$-type silicon carbide substrate (semiconductor wafer) 1 doped with an n-type impurity such as nitrogen (N) to have an impurity concentration of, for example, about 2×10$^{19}$/cm$^3$ is prepared. The front surface of the n$^+$-type silicon carbide substrate 1 may be, for example, a (000-1)-face 4 degrees off toward <11-20>. Next, on the front surface of the n$^+$-type silicon carbide substrate 1, an n-type silicon carbide epitaxial layer having a thickness of 10 μm and doped with an n-type impurity such as nitrogen to have an impurity concentration of, for example, 1.0×10$^{16}$/cm$^3$ is grown as the n-type drift layer 2.

Figure 3:
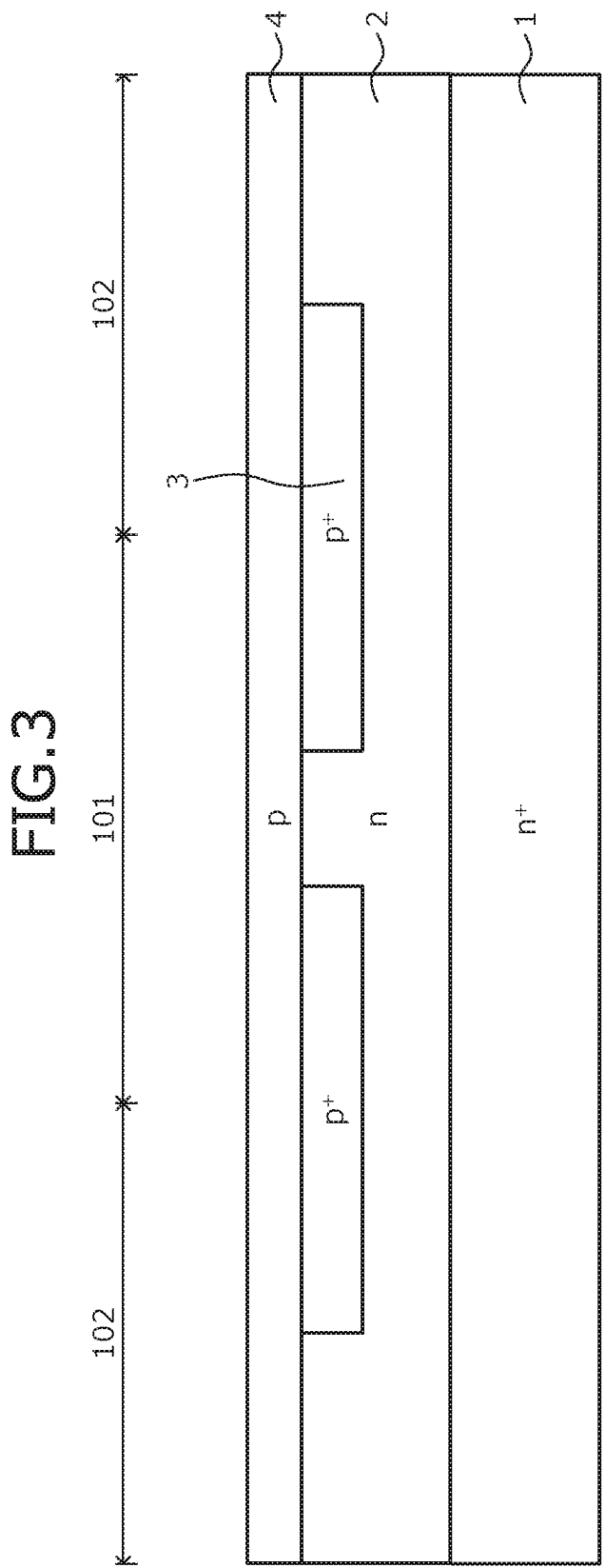

As depicted in FIG. 3, the p$^+$-type base region 3 is selectively formed in the surface layer of the n-type drift layer 2 in the active region 101, by photolithography and ion implantation. The outermost p$^+$-type base region 3 is formed to extend into the edge termination structure portion 102. In this ion implantation, for example, the dopant may be aluminum (Al) and the dose amount may be set so that the p$^+$-type base region 3 has an impurity concentration of 1.0×10$^{18}$/cm$^3$. The p$^+$-type base region 3 may have a thickness of, for example, 0.5 μm. A distance between adjacent p$^+$-type base regions 3 may be, for example, 1.6 μm.

Next, on the surface of the n-type drift layer 2, a p-type silicon carbide epitaxial layer that becomes the p-type base layer 4 is grown to have a thickness of, for example, 0.5 μm. The p-type base layer 4, for example, is doped with aluminum. At this time, for example, the p-type silicon carbide epitaxial layer may be grown to be doped with aluminum so that the p-type base layer 4 has an impurity concentration of 5.0×10$^{15}$/cm$^3$. As a result, the silicon carbide semiconductor base in which the n$^+$-type silicon carbide substrate 1, the n-type drift layer 2, and the p-type base layer 4 are sequentially deposited is produced.

Figure 4:
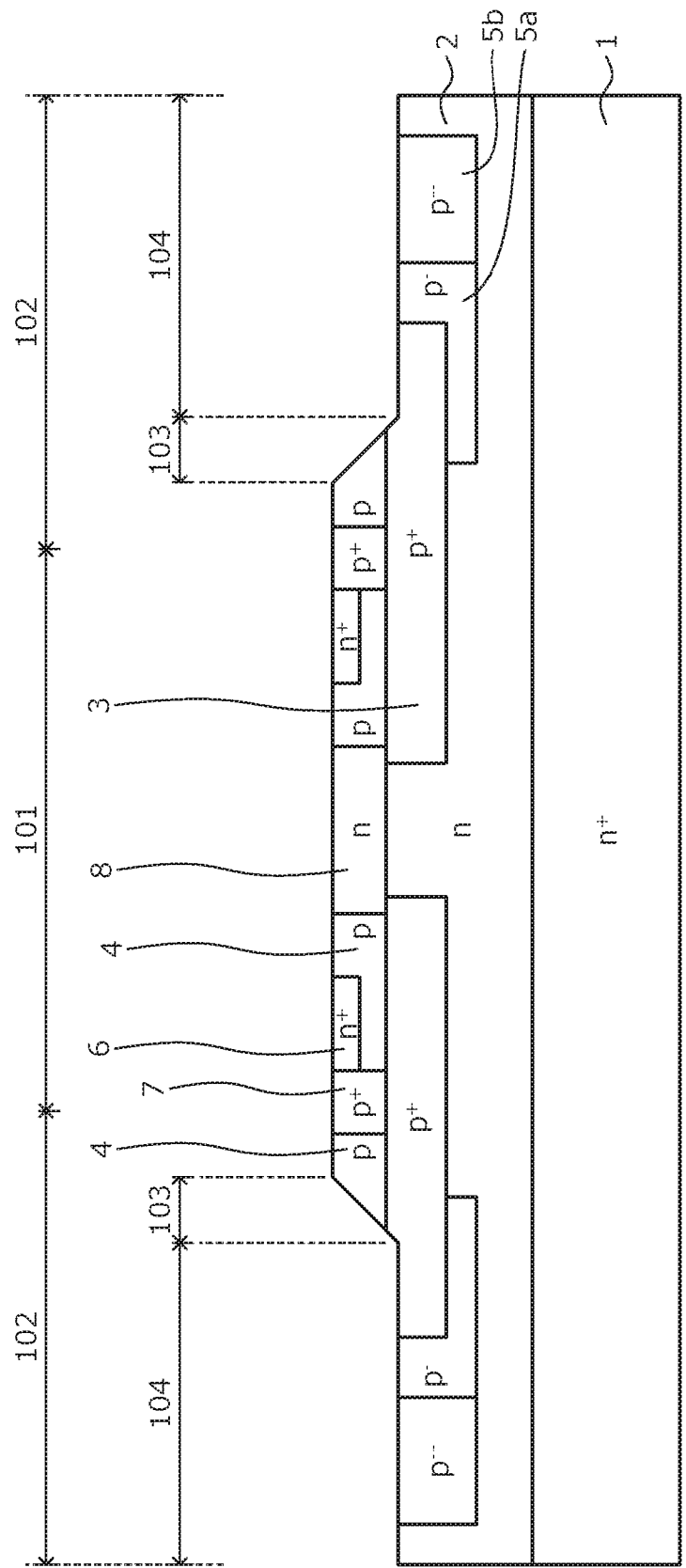

As depicted in FIG. 4, a conductivity type of a portion of the p-type base layer 4 on the n-type drift layer 2 is reversed by photolithography and ion implantation, and the n-type well region 8 is selectively formed. In this ion implantation, for example, the dopant may be nitrogen and the dose amount may be set so that the n-type well region 8 has an impurity concentration of 5.0×10$^{16}$/cm$^3$. The n-type well region 8 may have a width and a thickness of, for example, 2.0 μm and 0.6 μm, respectively. Next, the outer circumferential portion of the p-type base layer 4 in the edge termination structure portion 102 is removed by photolithography and etching, exposing the n-type drift layer 2 in the edge termination structure portion 102.

Removal of the outer circumferential portion of the p-type base layer 4 forms the step portion 103 of the edge termination structure portion 102, the step portion 103 being formed between the p-type base layer 4 and the n-type drift layer 2, near the boundary with the active region 101. Further, the flat portion 104 (portion becoming outer side of chip) where the surface of the n-type drift layer 2 is exposed is formed farther on the outer side than the step portion 103. At this time, of the outermost p$^+$-type base region 3, the portion extending into the flat portion 104 may be left to have a predetermined thickness, or the epitaxial layer at the outer circumferential portion of the edge termination structure portion 102 may be removed by a thickness (e.g., about 0.7 μm) greater than or equal to the thickness of the p-type base layer 4. In this case, of the outermost p$^+$-type base region 3, the portion extending into the flat portion 104 has a thickness of about 0.3 μm.

Next, photolithography and ion implantation are repeatedly performed, and in the surface layer of the n-type drift layer 2 exposed at the edge termination structure portion 102, the p⁻-type region 5a and the p⁻⁻⁻-type region 5b constituting a double zone JTE structure are each selectively formed. At this time, the p⁻-type region 5a is formed so as to cover the entire lower side of the portion of the outermost p⁺-type base region 3 extending into the flat portion 104. In the ion implantation for forming the p⁻-type region 5a, for example, aluminum may be used as the dopant and the dose amount may be set so that the impurity concentration of the p⁻-type region 5a is $6.0 \times 10^{17}/cm^3$. The p⁻-type region 5a may have a width and a thickness of, for example, 80 μm and 0.5 μm, respectively. In the ion implantation for forming the p⁻⁻⁻-type region 5b, for example, aluminum may be used as the dopant and the dose amount may be set so that the impurity concentration of the p⁻⁻⁻-type region 5b is $3.0 \times 10^{17}/cm^3$. The width and the thickness of the p⁻-type region 5b may be, for example, 60 μm and 0.5 μm, respectively.

Next, in the surface layer of a portion of the p-type base layer 4 on the p⁺-type base region 3, the n⁺-type source region 6 is selectively formed by photolithography and ion implantation. Next, in the surface layer of a portion of the p-type base layer 4 on the p⁺-type base region 3, the p⁺-type contact region 7 is selectively formed by photolithography and ion implantation. Next, heat treatment (annealing) is performed for activating the p⁻-type region 5a, the p⁻⁻⁻-type region 5b, the n⁺-type source region 6, the p⁺-type contact region 7, and the n-type well region 8. The heat treatment temperature and the heat treatment time, for example, may be 1620 degrees C. and 2 minutes, respectively. The sequence in which the p⁻-type region 5a, the p⁻⁻⁻-type region 5b, the n⁺-type source region 6, the p⁺-type contact region 7, and the n-type well region 8 are formed may be variously changed. The p⁻-type region 5a and the p⁻⁻⁻-type region 5b may be formed after formation of the flat portion 104 and before the activation heat treatment. An implantation region of the ion implantation for forming the p⁻-type region 5a and an implantation region of the ion implantation for forming the p⁺-type base region 3 may partially overlap. Further, the activation heat treatment may be performed for each ion implantation for forming each region.

Figure 5:
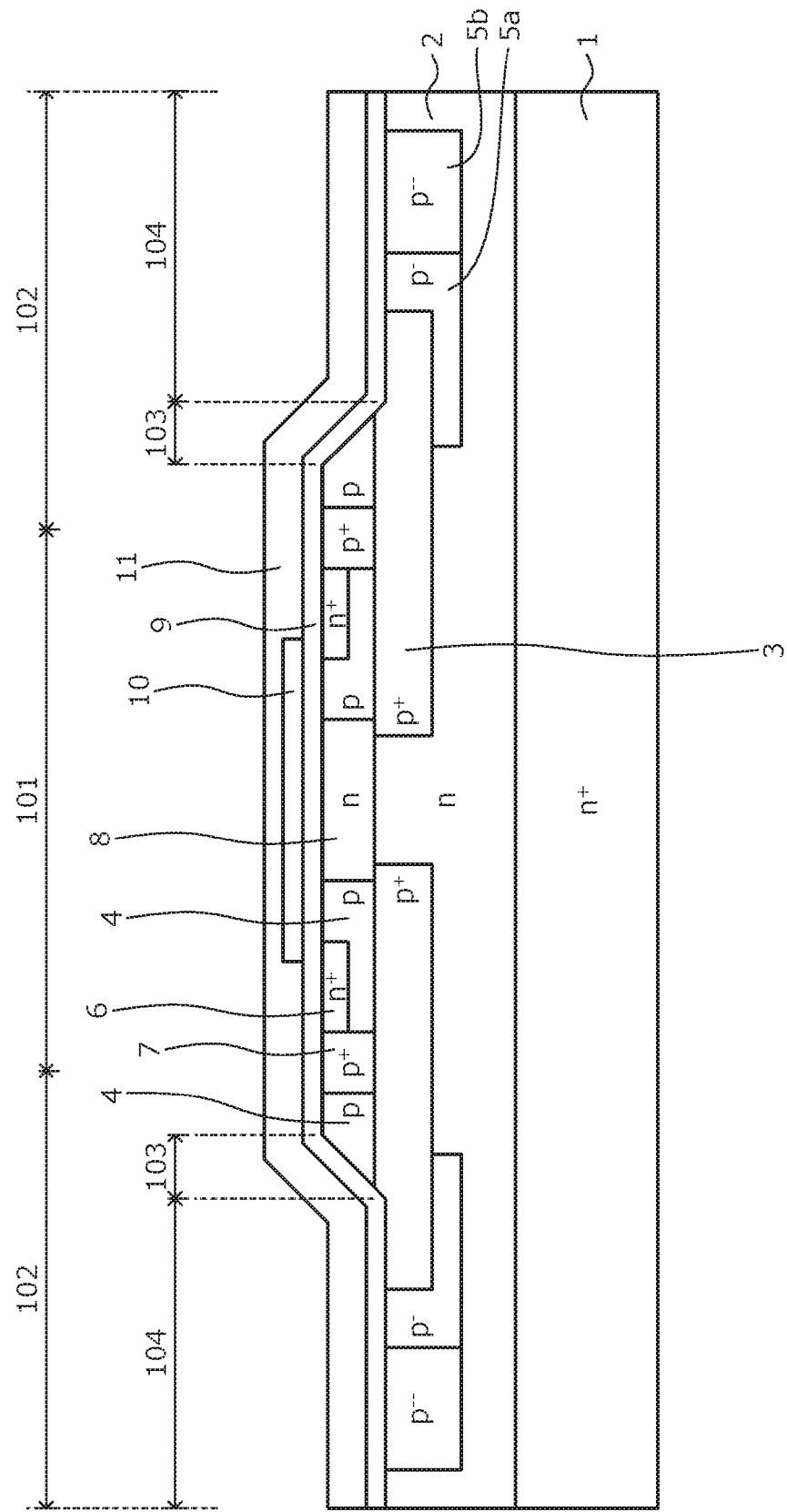

As depicted in FIG. 5, the front surface side of the silicon carbide semiconductor base is thermally oxidized and the gate insulating film 9 is formed having, for example, a thickness of about 100 nm. This thermal oxidation, for example, may be performed by heat treatment in a mixed atmosphere of oxygen ($O_2$) gas and hydrogen ($H_2$) gas at a temperature of about 1000 degrees C. As a result, the regions formed on the surfaces of the p-type base layer 4 and the n-type drift layer 2 are covered by the gate insulating film 9. On the gate insulating film 9, a polycrystalline silicon layer doped with, for example, phosphorus (P) is formed as the gate electrode 10. The polycrystalline silicon layer is patterned, leaving the polycrystalline silicon layer on a portion of the p-type base layer 4 between the n⁺-type source region 6 and the n-type well region 8. At this time, the polycrystalline silicon layer may be left on the n-type well region 8. Next, for example, phospho silicate glass (PSG) is deposited (formed) as the interlayer insulating film 11 so as to cover the gate insulating film 9 and have a thickness of about 1.0 μm.

Figure 6:
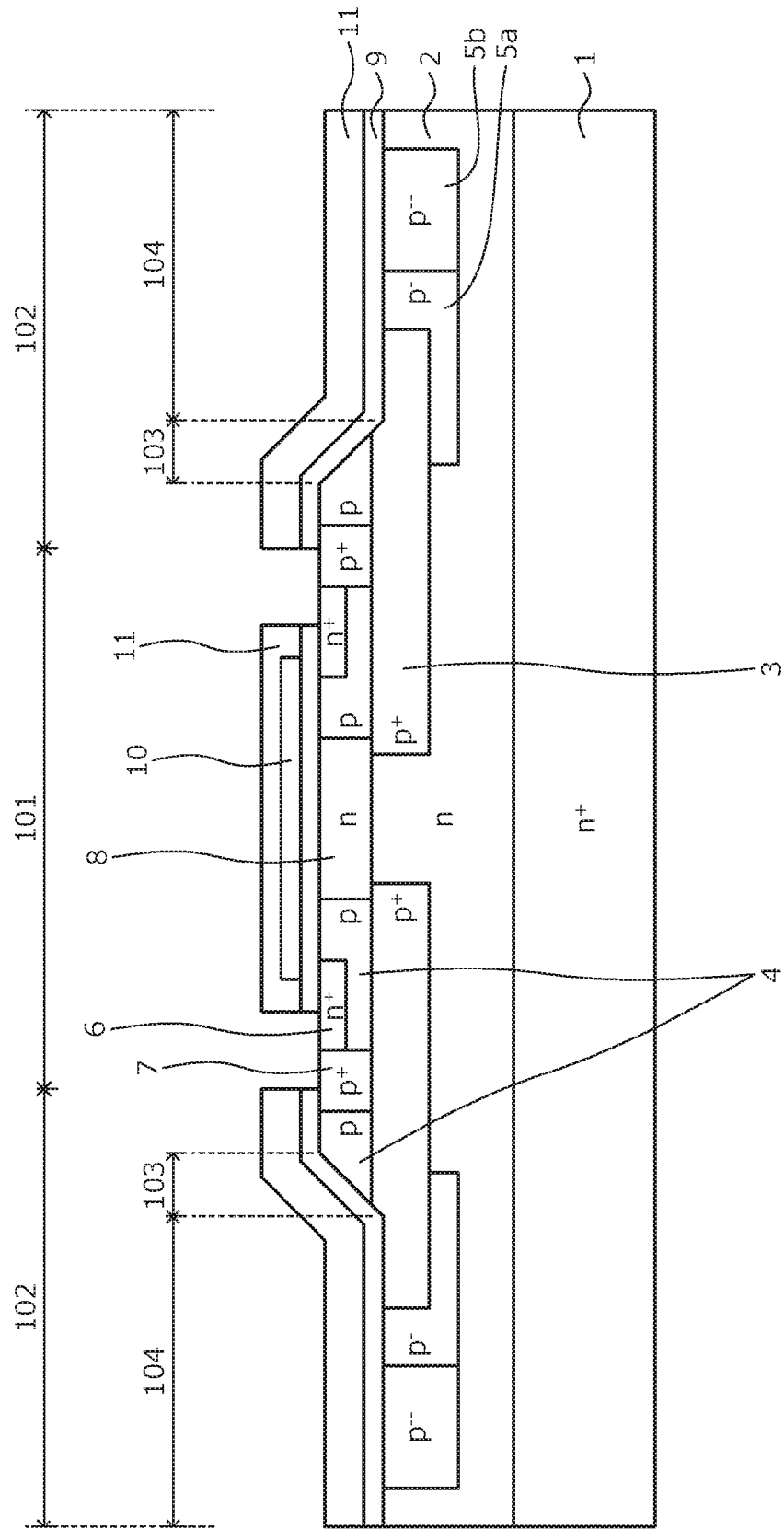
Figure 7:
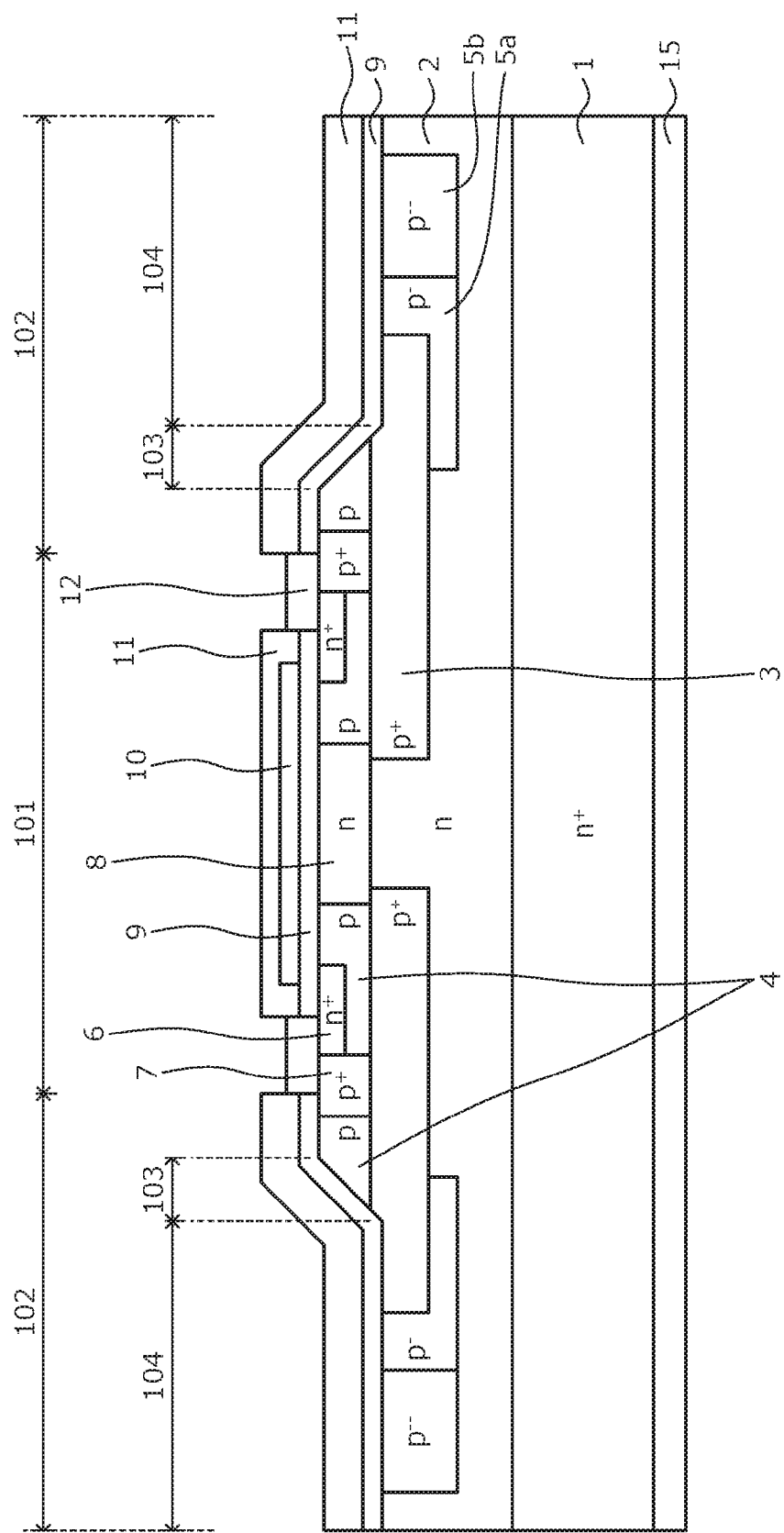

As depicted in FIG. 6, the interlayer insulating film 11 and the gate insulating film 9 are selectively removed by photolithography and etching, forming contact holes and exposing the n⁺-type source region 6 and the p⁺-type contact region 7. Next, heat treatment (reflow) for planarization of the interlayer insulating film 11 is performed. As depicted in FIG. 7, on the interlayer insulating film 11, for example, nickel (Ni) films that become the source electrodes 12 are formed so as to be embedded in the contact holes. Next, each nickel film is selectively removed by photolithography and etching, leaving the nickel film only on the n⁺-type source region 6 and the p⁺-type contact region 7 exposed in the contact hole. Next, on the entire rear surface (rear surface of the n⁺-type silicon carbide substrate 1) of the silicon carbide semiconductor base, for example, a nickel film is formed that is the lowest layer of metal films constituting the rear electrode 15.

Next, for example, heat treatment at a temperature of about 970 degrees C. is performed, causing the nickel films on both sides of the silicon carbide semiconductor base to react with silicon carbide semiconductor portions and form nickel silicide films. As a result, an ohmic junction of the source electrode 12 and a silicon carbide semiconductor portion, and an ohmic junction of the rear electrode 15 and a silicon carbide semiconductor portion are formed. Next, for example, the front electrode pad 13 is deposited (formed) by a sputtering method on the entire front surface of the silicon carbide semiconductor base so as to cover the source electrode 12. A portion of the front electrode pad 13 on the interlayer insulating film 11 may have a thickness of, for example, about 5 μm. The front electrode pad 13, for example, may be formed of a metal having aluminum as a main constituent. The front electrode pad 13 is patterned, exposing the interlayer insulating film 11 at the edge termination structure portion 102.

Next, for example, a polyimide film is formed as the protective film 14 on the surfaces of the interlayer insulating film 11 and the front electrode pad 13. The protective film 14 is selectively removed by photolithography and etching, exposing the front electrode pad 13 and leaving the protective film 14 so as to extend from on the interlayer insulating film 11 in the edge termination structure portion 102, to an end portion of the front electrode pad 13. Next, on the entire surface of the nickel silicide film on the rear surface of the silicon carbide semiconductor base, a multilayer film constituted by, for example, a titanium (Ti) film, a nickel film, and a gold (Au) film sequentially stacked, is formed as the rear electrode pad 16. Thereafter, the semiconductor wafer is cut (diced) into chips, completing MOSFET depicted in the FIG. 1.

As described, according to the first embodiment, the outermost p⁺-type base region extends into the flat portion of the edge termination structure portion and the entire lower side of the portion of the outermost p⁺-type base region extending into the flat portion is covered by an inner circumferential portion of the p-type region that is farther on the inner side among the p-type regions constituting the edge termination structure and therefore, when high voltage is applied to the drain electrode, electric field may be caused to concentrate at an outer circumferential end portion of the outermost p⁺-type base region or at the plural p-type regions constituting the edge termination structure. Therefore, even in the case of a configuration in which a low-impurity-concentration p-type base layer is formed in the active region by epitaxial growth and the ON resistance is reduced, the concentration of electric field at the step portion occurring consequent to the formation of the p-type base layer may be prevented.

Further, since electric field may be caused to concentrate at the plural p-type regions constituting the edge termination structure, the expansion of a depletion layer to the side of the low-impurity-concentration p-type base layer formed by epitaxial growth may be prevented. As a result, decreases in the breakdown voltage may be prevented, enabling breakdown voltage to be improved more than by a conventional means. Therefore, a high-voltage semiconductor device having low ON resistance may be provided. Further, according to the first embodiment, by suitably changing opening ranges of masks used in the ion implantation for forming the outermost p$^+$-type base region and in the ion implantation for forming the innermost p-type region farthest on the inner side among the p-type regions constituting the edge termination structure, a high-voltage semiconductor device having low ON resistance may be produced without the addition of new processes.

Figure 8:
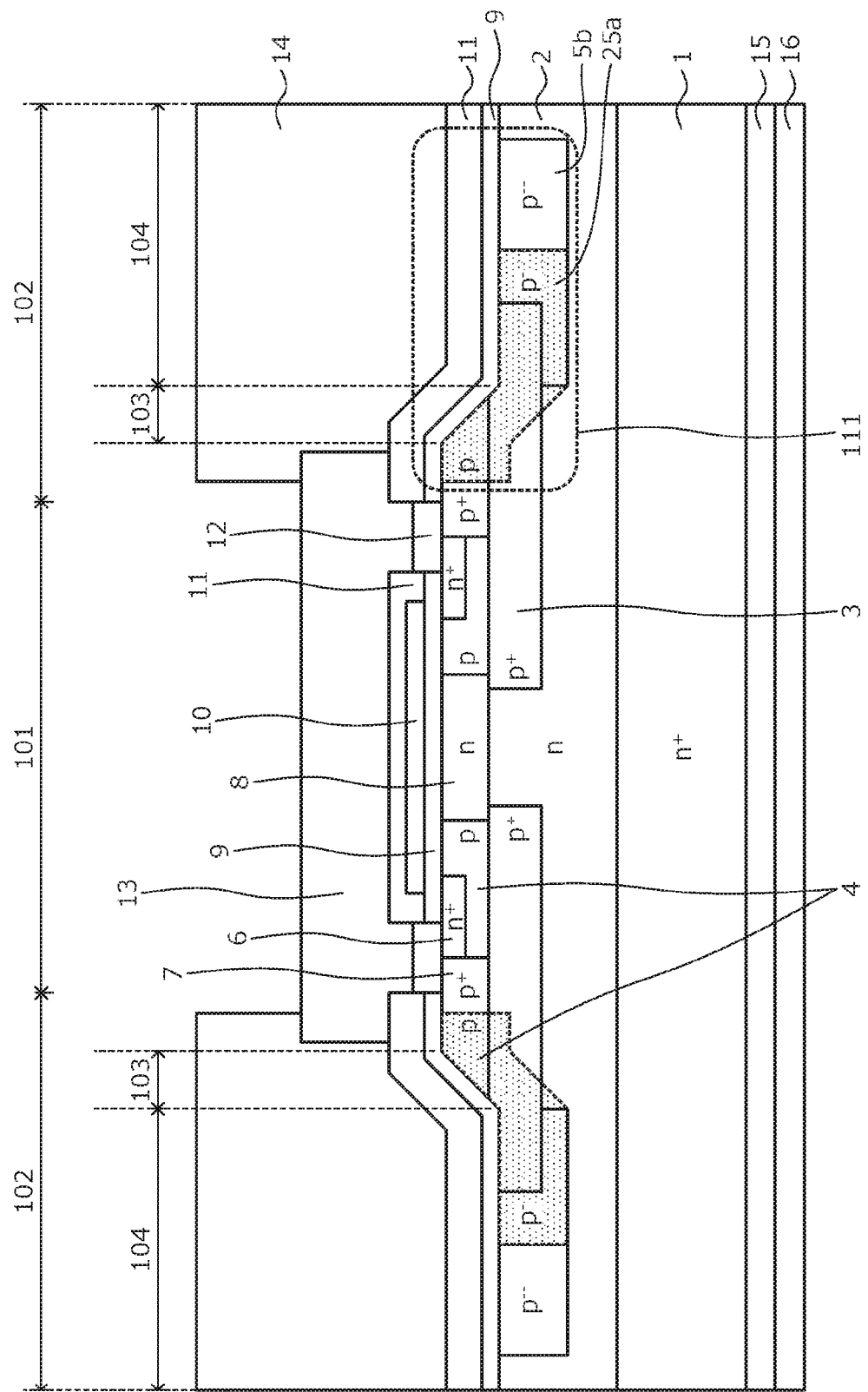
FIG. 8 is a cross-sectional view of a structure of the semiconductor device according to a second embodiment.

A structure of the semiconductor device according to a second embodiment will be described. FIG. 8 is a cross-sectional view of the structure of the semiconductor device according to the second embodiment. The semiconductor device according to the second embodiment differs from the semiconductor device according to the first embodiment in that among the two p-type regions (a p$^-$-type region 25a and the p$^{--}$-type region 5b) constituting the double zone JTE structure, the inner side p$^-$-type region 25a extends along the base front surface, from the flat portion 104 to the active region 101, and is provided to overlap the outer circumferential portion of the p-type base layer 4.

In particular, the p$^-$-type region 25a is provided so as to overlap the portion of the p$^+$-type base region 3 extending into the flat portion 104 and the step portion 103 and to overlap the portion of the p-type base layer 4 extending into the step portion 103, e.g., contact the outermost p$^+$-type contact region 7 that is farthest on the outer side (hatched portion in drawing). The method of manufacturing the semiconductor device according to the second embodiment may be performed by performing in the method of manufacturing the semiconductor device according to the first embodiment, ion implantation for forming the p$^-$-type region 25a, this ion implantation being performed for a wide range overlapping the outer circumferential portion of the p-type base layer 4. At this time, an implantation region of the ion implantation for forming the p$^-$-type region 25a and an implantation region of the ion implantation for forming the p$^+$-type base region 3 may partially overlap.

As described, according to the second embodiment, the innermost p-type region constituting the edge termination structure is provided to overlap the portion of the outermost p$^+$-type base region extending into the flat portion whereby effects identical to those of the first embodiment may be obtained. Further, according to the second embodiment, by providing the innermost p-type region constituting the edge termination structure to overlap up to a portion of the p-type base layer, the impurity concentration of the outer circumferential portion of the p-type base layer may be increased. As a result, expansion of a depletion layer into the p-type base layer may be prevented. Further, according to the second embodiment, the impurity concentration of the outer circumferential portion of the p-type base layer may be increased and variation of the breakdown voltage consequent to process variation may be avoided.

Figure 9:
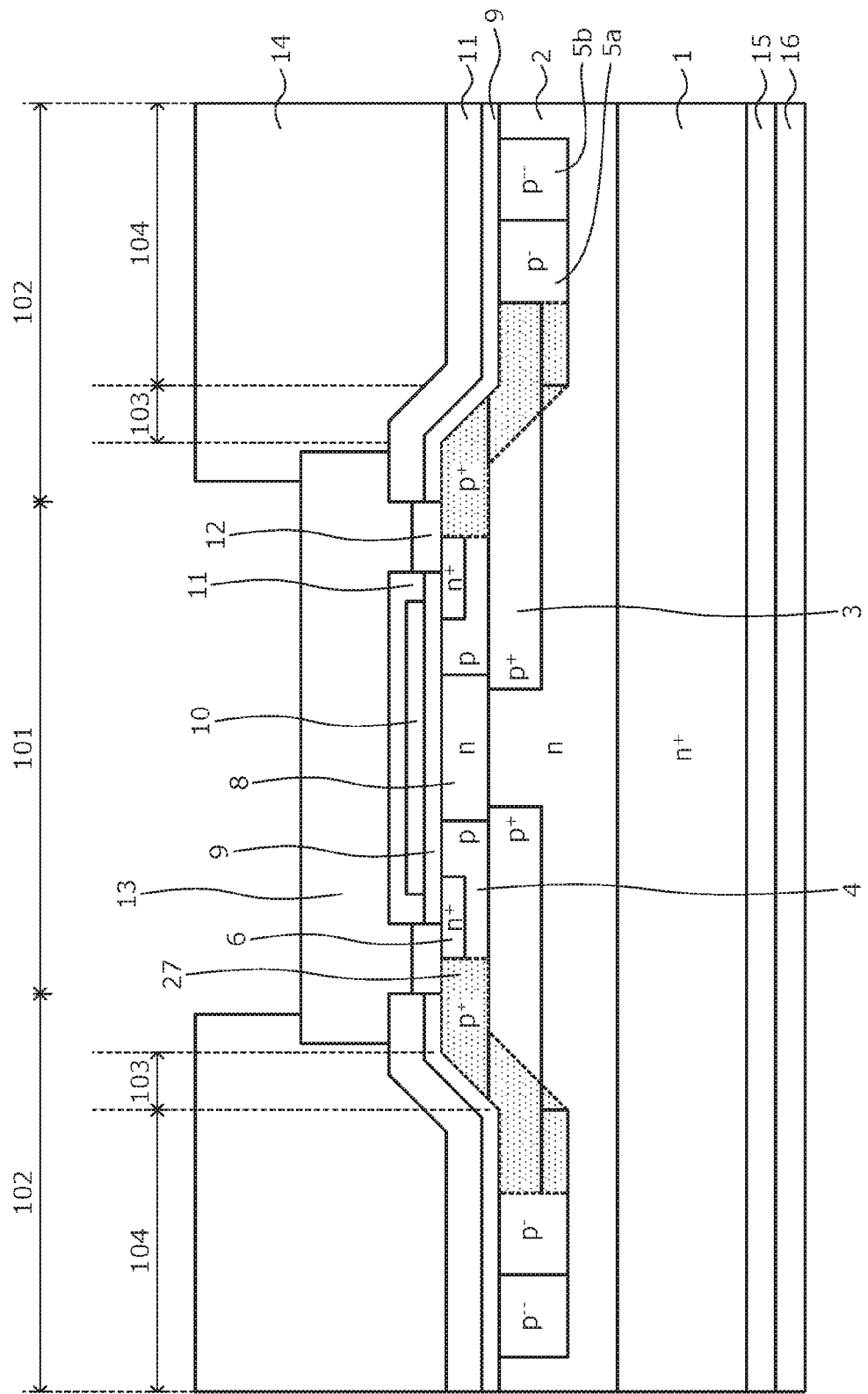
FIG. 9 is a cross-sectional view of a structure of the semiconductor device according to a third embodiment.

A structure of the semiconductor device according to a third embodiment will be described. FIG. 9 is a cross-sectional view of the structure of the semiconductor device according to the third embodiment. The semiconductor device according to the third embodiment differs from the semiconductor device according to the first embodiment in that an outermost p$^+$-type contact region (fifth semiconductor region) 27 that is farthest on the outer side is provided to extend along the base front surface, from the active region 101 to the flat portion 104, and to overlap the inner circumferential portion of the p$^-$-type region 5a that is farther on the inner side among the two p-type regions constituting the double zone JTE structure.

In particular, the outermost p$^+$-type contact region 27 is provided so as to overlap, the portion of the p-type base layer 4 extending into the step portion 103, the portion of the p$^+$-type base region extending into the flat portion 104 and the step portion 103, and the portion of the p$^-$-type region 5a covering the lower side of the p$^+$-type base region 3 (hatched portion in drawing). The method of manufacturing the semiconductor device according to the third embodiment may be performed by performing in the method of manufacturing the semiconductor device according to the first embodiment, ion implantation for forming the p$^+$-type contact region 27, this ion implantation being performed for a wide range overlapping the inner circumferential portion of the p$^-$-type region 5a. At this time, an implantation region of the ion implantation for forming the p$^+$-type contact region 27 and an implantation region of the ion implantation for forming the p$^+$-type base region 3 may partially overlap.

In the third embodiment, the entire lower side of the portion of the p$^+$-type base region 3 extending into the flat portion 104 is covered by the outermost p$^+$-type contact region 27. Therefore, the lower side of the portion of the p$^+$-type base region 3 extending into the flat portion 104 need not be covered by the p$^-$-type region 5a. In other words, the outermost p$^+$-type contact region 27 may be provided so as to overlap the portion of the p-type base layer 4 extending into the step portion 103, and the portion of the p$^+$-type base region 3 extending into the flat portion 104 and the step portion 103 (not depicted). Further, when the lower side of the portion of the p$^+$-type base region 3 extending into the flat portion 104 is covered by the p$^-$-type region 5a, the outermost p$^+$-type contact region 27 may be extended to an extent that the outermost p$^+$-type contact region 27 contacts the inner circumferential end portion of the p$^-$-type region 5a.

As described, according to the third embodiment, the outermost p$^+$-type contact region is provided so as to overlap up to a portion of the innermost p-type region constituting the edge termination structure and when high voltage is applied to the drain electrode, electric field may be caused to concentrate at an outer circumferential end portion of the outermost p$^+$-type contact region or at the plural p-type regions constituting the edge termination structure. As a result, effects identical to those of the first embodiment may be obtained. Further, according to the third embodiment, by providing the outermost p$^+$-type contact region so as to overlap a portion of the innermost p-type region constituting the edge termination structure, the impurity concentration of the outer circumferential portion of the p-type base layer may be increased. As a result, effects identical to those of the second embodiment may be obtained.

Figure 10:
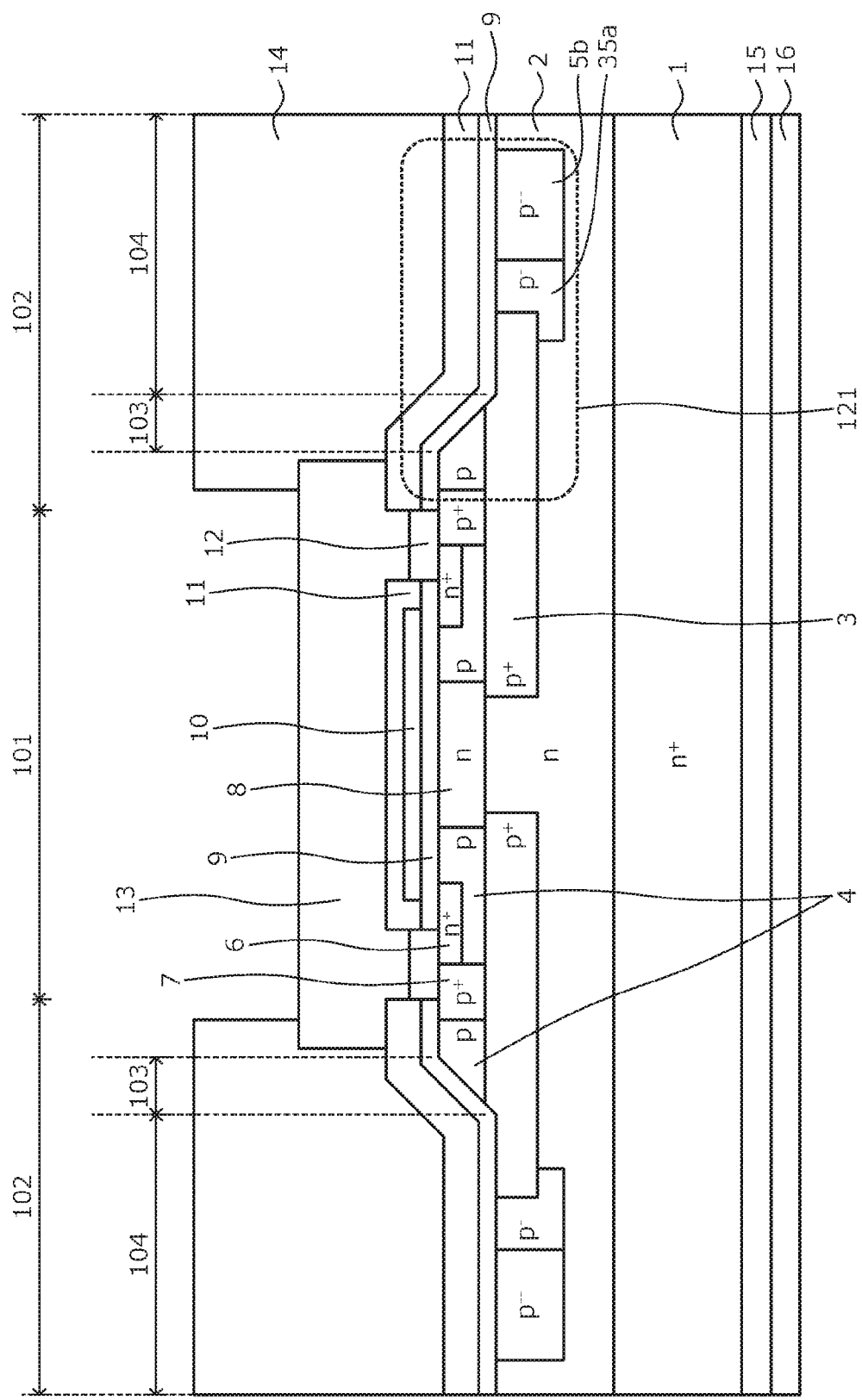
FIG. 10 is a cross-sectional view of a structure of a semiconductor device of a comparison example 1.
Figure 11:
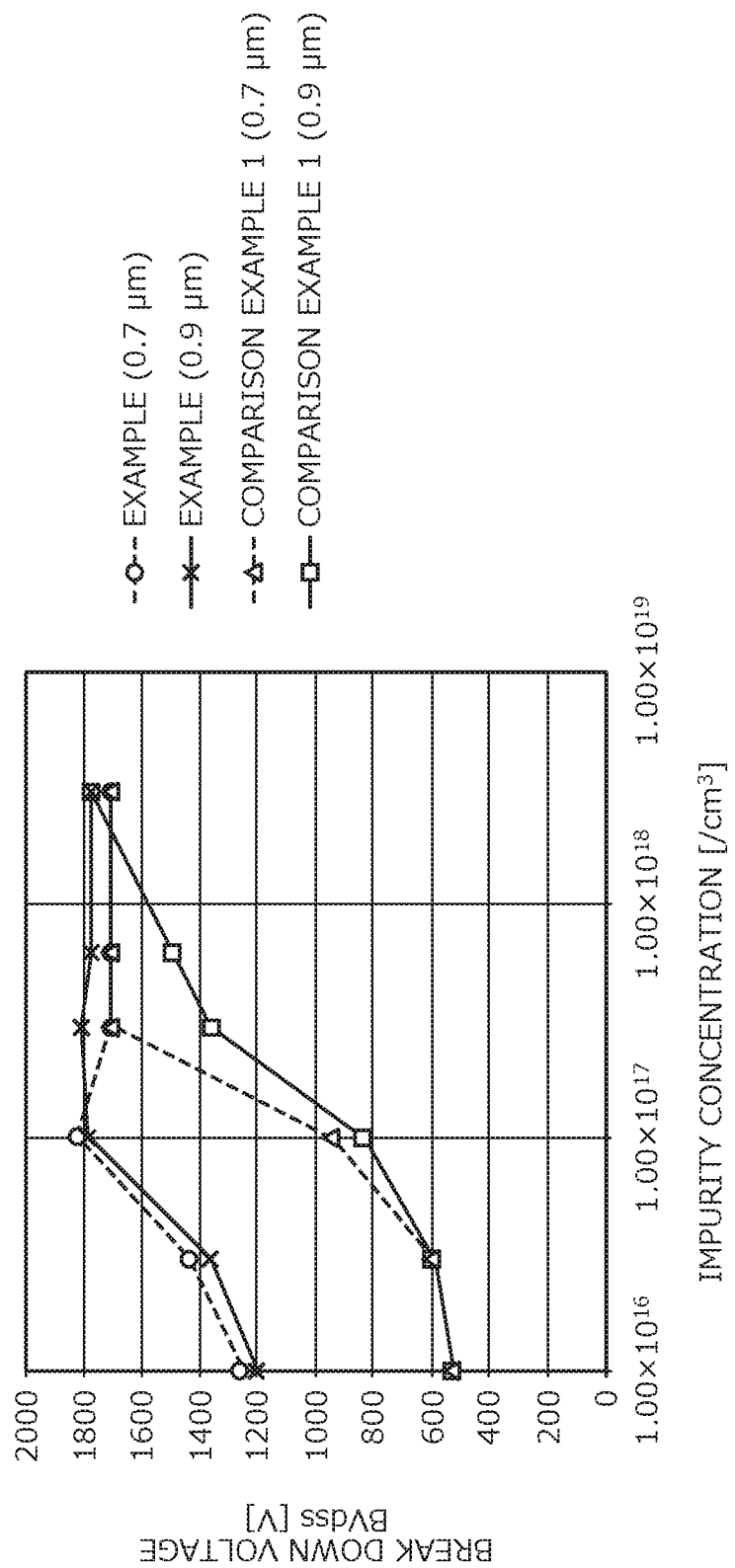
FIG. 11 is a characteristics diagram depicting the relationship of breakdown voltage and impurity concentration of an inner side $p^-$-type region constituting a double zone JTE structure.

Verification concerning breakdown voltage of semiconductor device according an example was performed. FIG. 10 is a cross-sectional view of a structure of a semiconductor device of a comparison example 1. FIG. 11 is a characteristics diagram depicting the relationship of breakdown voltage and impurity concentration of the inner side p$^-$-type region constituting a double zone JTE structure. First, according to the method of manufacturing the semiconductor device according to the second embodiment and conditions described above as examples, a MOSFET (refer to FIG. 8) was produced having an inner side p$^-$-type region 25a that constitutes a double zone JTE structure and is provided so as to overlap up to a portion of the p-type base layer 4 (hereinafter, Example). For comparison, a MOSFET (refer to FIG. 10) was produced in which a lower side of a portion of the outermost p+-type base region 3 extending into the flat portion 104 is covered by an inner side p−-type region 35a constituting a double zone JTE structure (hereinafter, comparison example 1).

Example and comparison example 1 were each produced as two samples in which an etching amount (etching depth) of the epitaxial layer when the step portion 103 was formed in the edge termination structure portion 102 was a standard 0.7 μm (hereinafter, standard etching amount) and an amount deeper that the standard amount, 0.9 μm (hereinafter, excessive etching amount). In Example and comparison example 1, the impurity concentration of the outer side p−−−-type region 5b constituting the double zone JTE structure was half the impurity concentration of the inner side p−-type regions 25a, 35a. Other than the p−-type region 35a, the configuration of the comparison example 1 was identical to that of Example. Simulation results of the relationship of the impurity concentrations and breakdown voltages of the p−-type regions 25a, 35a of Example and comparison example 1 are depicted in FIG. 11. In FIG. 11, the horizontal axis represents impurity concentration of the p−-type regions 25a, 35a, and the vertical axis represents breakdown voltage BVdss.

From the results depicted in FIG. 11, in the case of the standard etching amount in comparison example 1, it was confirmed that when the impurity concentration of the p−-type region 35a is less than $3.0 \times 10^{17}/cm^3$, the breakdown voltage decreases. Further, in the case of the excessive etching amount in comparison example 1, it was confirmed that when the impurity concentration of the p−-type region 35a was less than $3.0 \times 10^{18}/cm^3$, the breakdown voltage decreased. Thus, it was found that breakdown voltage decreases consequent to the concurrent occurrence of decreased the activation rate and decreased carrier concentration from over etching. On the other hand, in Example, in the case of the standard etching amount and in the case of the excessive etching amount, it was confirmed that when the impurity concentration of the p−-type region 25a was less than $1.00 \times 10^{17}/cm^3$, the breakdown voltage decreased. Thus, it was confirmed that Example is a structure that is minimally affected adversely by process variation.

Figure 12:
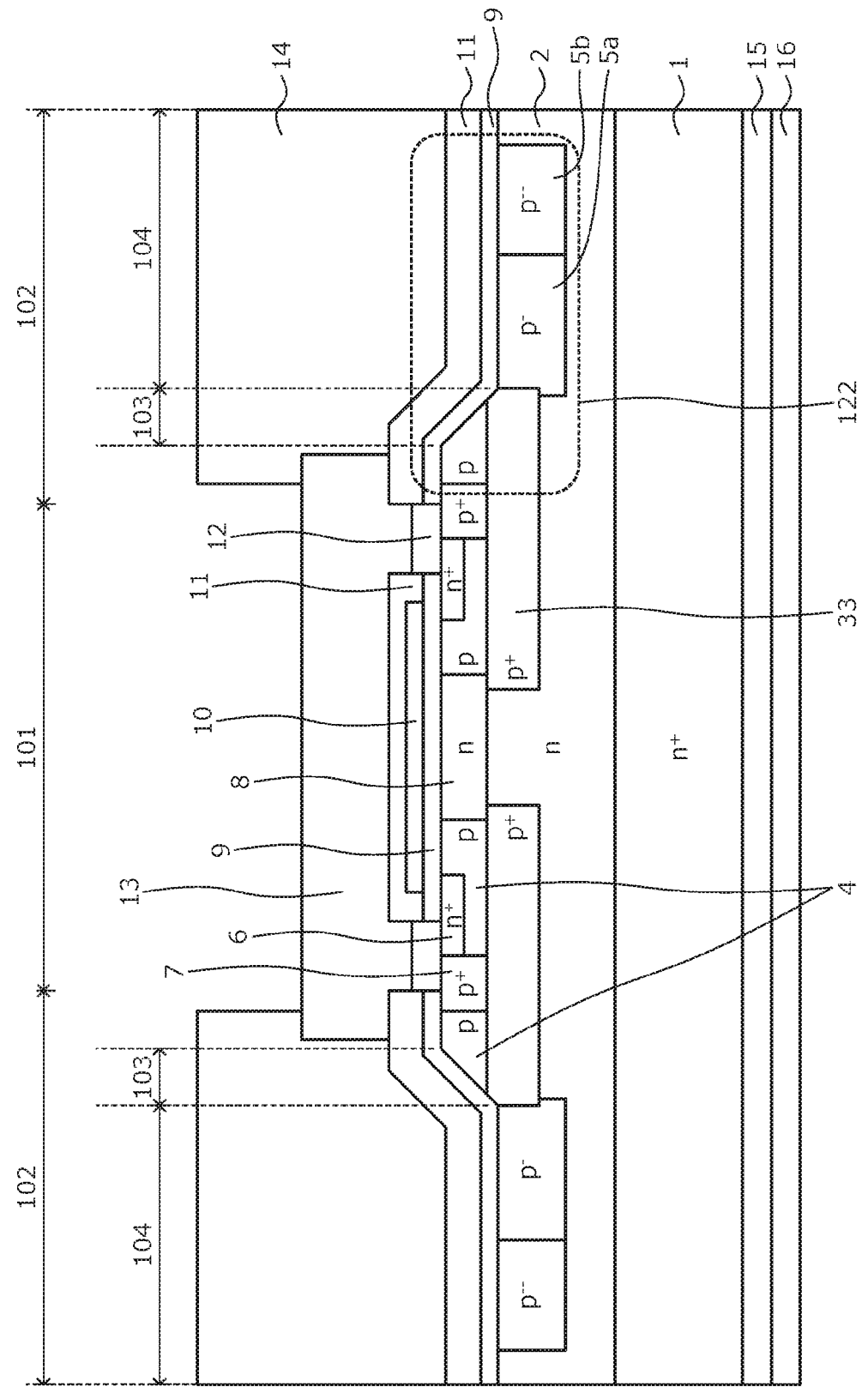
FIG. 12 is a cross-sectional view of a structure of a semiconductor device of comparison example 2.
Figure 13A:
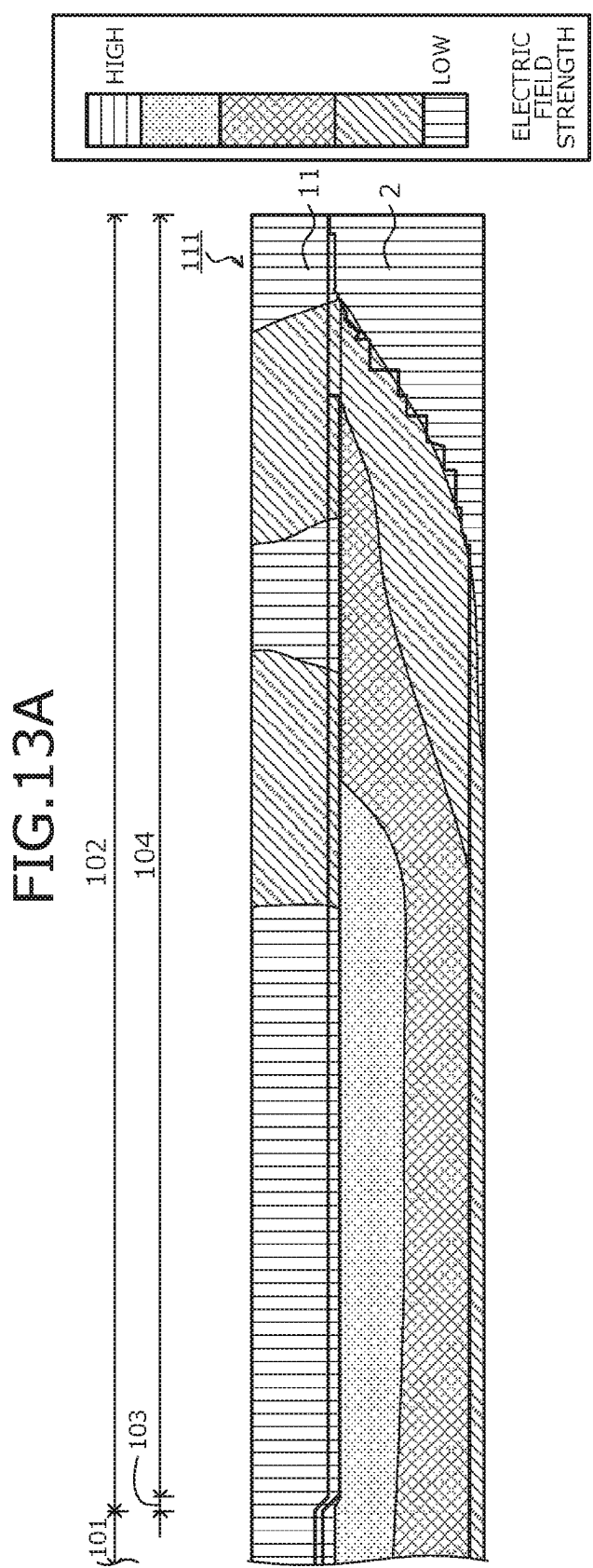

Verification concerning electric field strength distribution near the boundary of the active region and the edge termination structure portion of the semiconductor device according to Example was performed. FIG. 12 is a cross-sectional view of a structure of a semiconductor device of comparison example 2. FIGS. 13A, 13B, and 13C are characteristics diagrams depicting electric field strength distribution near the boundary of the active region and the edge termination structure portion. FIG. 13A depicts electric field strength distribution of an edge termination structure portion 111 of Example (refer to FIG. 8). FIG. 13B depicts electric field strength distribution of an edge termination structure portion 121 of comparison example 1 (refer to FIG. 10). FIG. 13C depicts electric field strength distribution of an edge termination structure portion 122 of comparison example 2 (refer to FIG. 12). Comparison example 2 has a configuration in which the outermost p+-type base region 33 does not extend into the flat portion 104. Other than the p+-type base region 33, the configuration of comparison example 2 is identical to that of comparison example 1.

As depicted in FIG. 13B, in comparison example 1, it was confirmed that electric field concentrates at a vicinity 131 of the boundary of the active region 101 and the edge termination structure portion 102. On the other hand, as depicted in FIG. 13A, in Example, it was confirmed that electric field may be distributed in the edge termination structure portion 102. Thus, like Example, it was confirmed that the entire lower side of the portion of the outermost p+-type base region 3 extending into the flat portion 104 being covered by the inner side p−-type region 25a constituting the double zone JTE structure enables electric field concentration of the active region 101 to be mitigated.

Further, as depicted in FIG. 13C, in comparison example 2, it was confirmed that electric field concentrates at a vicinity 132 of the boundary of the active region 101 and the edge termination structure portion 102. In other words, it was confirmed that when the outermost p+-type base region 33 is not extended into the flat portion 104 like comparison example 2, similar to comparison example 1, electric field concentration of the active region 101 may not be mitigated and the breakdown voltage decreases. On the other hand, in Example, by extending the outermost p+-type base region 3 into the flat portion 104, the location where electric field concentrates may be moved to the flat portion 104. Therefore, electric field concentration of the active region 101 may be mitigated, enabling high breakdown voltage to be sustained.

Therefore, from the results in FIGS. 11, 13A, 13B, and 13C, like Example, it was confirmed that by extending the outermost p+-type base region 3 into the flat portion 104 and covering the entire lower side of the portion of the p+-type base region 3 extending into the flat portion 104 by the p−-type region 25a, high breakdown voltage may be sustained. Although not depicted, in the semiconductor devices according to the first and third embodiments (refer to FIGS. 1, 9), similar to Example (the semiconductor device according to the second embodiment), since the outermost p+-type base region 3 is extended into the flat portion 104 and the entire lower side of the portion of the p+-type base region 3 extending into the flat portion 104 is covered by the p−-type region 5a or by the p+-type contact region 27, effects identical to those of Example are obtained.

Figure 14:
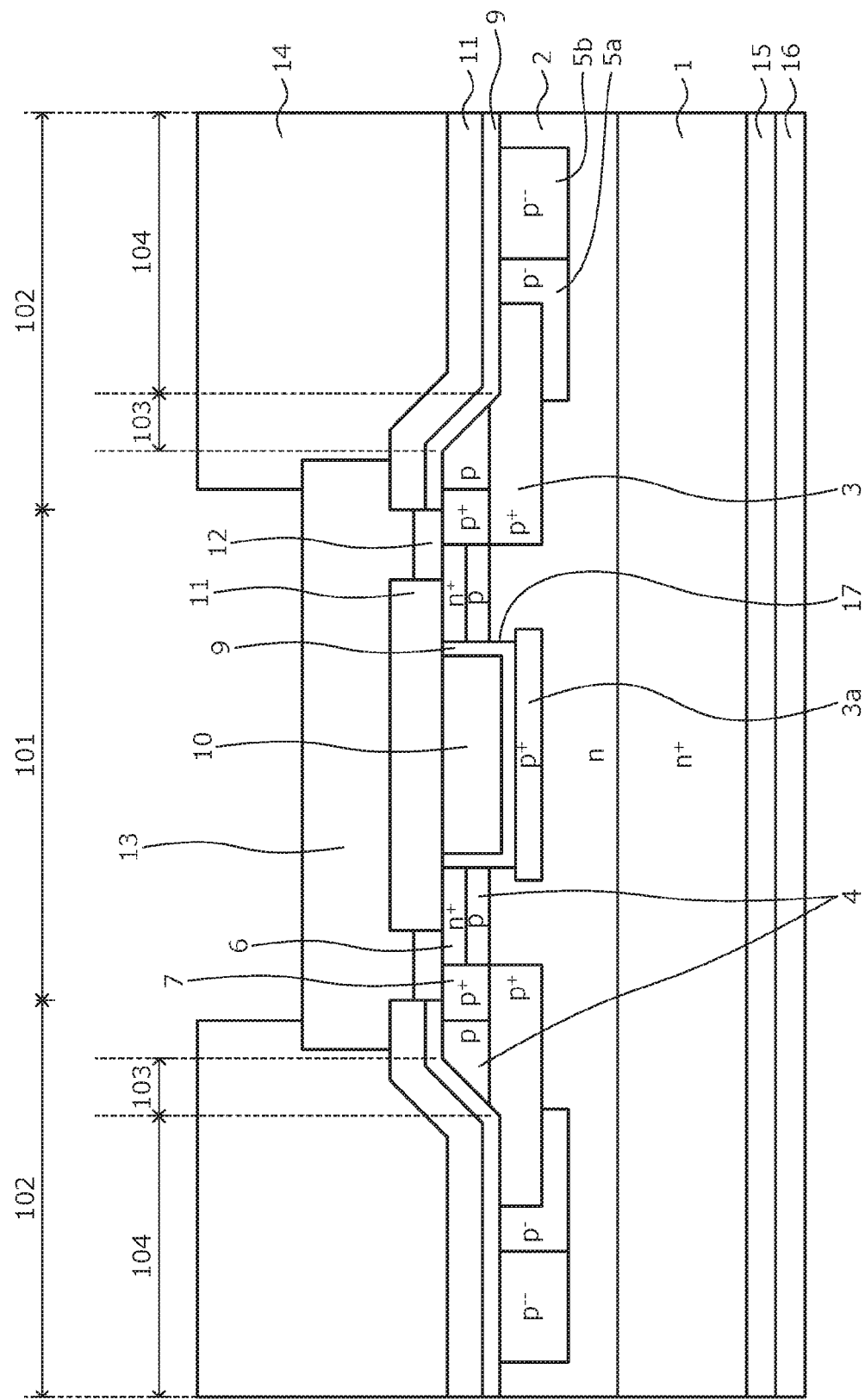
FIG. 14 is a cross-sectional view of a structure of the semiconductor device according to a fourth embodiment.

A structure of the semiconductor device according to a fourth embodiment will be described taking, as an example, a vertical MOSFET having a trench gate structure that uses a silicon carbide (SiC) semiconductor. FIG. 14 is a cross-sectional view of the structure of the semiconductor device according to the fourth embodiment. The semiconductor device according to the fourth embodiment and depicted in FIG. 14 is manufactured (produced) using a silicon carbide semiconductor base (semiconductor chip) formed by sequentially depositing on a front surface of an n+-type silicon carbide substrate 1 that becomes an n+-type drain layer, a n-type silicon carbide epitaxial layer that becomes an n-type drift layer (first semiconductor layer) 2 and a p-type silicon carbide epitaxial layer that becomes a p-type base layer (second semiconductor layer) 4. On the silicon carbide semiconductor base, an active region 101 is provided near a center portion and an edge termination structure portion 102 is provided in an outer circumferential portion surrounding a periphery of the active region 101. The active region 101 is an area through which main current flows during an ON state. The edge termination structure portion 102 is a region that mitigates electric field on a base front surface side of the n-type drift layer 2 and sustains the breakdown voltage.

On a front surface side of the silicon carbide semiconductor base, the p-type silicon carbide epitaxial layer that becomes the p-type base layer 4 extends from the active region 101 to near a boundary of the active region 101 and the edge termination structure portion 102. In other words, on the front surface of the silicon carbide semiconductor base, near the boundary of the edge termination structure portion 102 with the active region 101, an outer circumferential portion of the p-type base layer 4 is removed whereby a step portion 103 occurring between the p-type base layer 4 and the n-type drift layer 2 is provided. A portion of the front surface of the silicon carbide semiconductor base, farther outward (chip edge portion side) than the step portion 103 is a flat portion 104 exposing a surface of the n-type drift layer 2. The base front surface (surface of a p$^-$-type region (second semiconductor region) 5a and a p$^{---}$-type region 5b described hereinafter) in the flat portion 104 is at a position that is deeper (closer to base rear surface) than a position of the base front surface in the active region 101 (surface of the p-type base layer 4).

In the active region 101, on a front surface side (the p-type base layer 4 side) of the silicon carbide semiconductor base, a metal oxide film semiconductor (MOS) insulated gate structure having a trench gate structure is provided. FIG. 14 depicts a single unit cell among one or more unit cells (element functional unit) arranged in the active region 101. In particular, in a surface layer on an opposite side of the n-type drift layer 2 (n-type silicon carbide epitaxial layer) from an n$^+$-type silicon carbide substrate 1 side, a p$^+$-type base region (first semiconductor region) 3 and a p$^+$-type base region 3a are selectively provided. The outermost p$^+$-type base region 3 that is farthest on an outer side (the edge termination structure portion 102 side) extends into the flat portion 104 of the edge termination structure portion 102 and is exposed at the base front surface in the flat portion 104 (i.e., a portion of the edge termination structure portion 102 where the p-type base layer 4 is not deposited). The p$^+$-type base region 3 together with the p-type base layer 4 constitutes a base region.

On the surface of the opposite side of the n-type drift layer 2 from the n$^+$-type silicon carbide substrate 1 side, the p-type base layer 4 (p-type silicon carbide epitaxial layer) is selectively deposited so as to cover portions of the p$^+$-type base region 3 other than a portion thereof extending into the flat portion 104 and to cover a portion of the n-type drift layer 2 between adjacent p$^+$-type base regions 3. The p-type base layer 4 has an impurity concentration that is lower than an impurity concentration of the p$^+$-type base region 3. Formation of the p-type base layer 4 by epitaxial growth enables the crystalline property of the portion in which a channel is formed to be raised whereby the channel resistance (i.e., ON resistance) may be lowered. An n$^+$-type source region (third semiconductor region) 6 and a p$^+$-type contact region (fifth semiconductor region) 7 are each selectively provided in a portion of the p-type base layer 4 on the p$^+$-type base region 3. The n$^+$-type source region 6 and the p$^+$-type contact region 7 contact each other. The n$^+$-type source region 6 is arranged at a position that is closer to an n-type well region (fourth semiconductor region) 8 described hereinafter than a position of the p$^+$-type contact region 7 is.

In the p-type base layer 4, a trench 17 is provided, penetrating the p-type base layer 4 in a depth direction and reaching the n-type drift layer 2. The n-type well region 8 is a junction field effect transistor (JFET) region arranged between adjacent base regions and directly beneath (base side of) a gate electrode 10. A gate electrode 10 is provided in the trench 17, via a gate insulating film 9. The p$^+$-type base region 3a is downward the trench 17. Although not depicted, when multiple unit cells are arranged, the MOS gate structures of the unit cells are arranged in parallel.

An interlayer insulating film 11 is provided on the entire front surface side of the silicon carbide semiconductor base so as to cover the gate electrode 10. A source electrode (first electrode) 12 contacts the n$^+$-type source region 6 and the p$^+$-type contact region 7 via a contact hole that penetrates the interlayer insulating film 11 in the depth direction, and the source electrode 12 is electrically insulated from the gate electrode 10 by the interlayer insulating film 11. A front electrode pad 13 is provided across the active region 101 entirely so as to contact the source electrodes 12 of all of the unit cells. An end portion of the front electrode pad 13 extends onto the interlayer insulating film 11 of the edge termination structure portion 102 and, for example, terminates farther on an inner side (the active region 101 side) than the step portion 103. On the interlayer insulating film 11 in the edge termination structure portion 102, a protective film 14 such as, for example, a passivation film formed from polyimide is provided so as to cover the end portion of the front electrode pad 13 and an outer-side end portion of the source electrode 12 of the outermost unit cell farthest on the outer side. The protective film 14 has a function of preventing discharge.

Further, in the edge termination structure portion 102, in the surface layer on the opposite side of the n-type drift layer 2 from the n$^+$-type silicon carbide substrate 1 side, an edge termination structure constituted by multiple p-type regions of differing impurity concentrations (the p$^-$-type region 5a and the p$^{---}$-type region 5b) is provided. The edge termination structure has a function of mitigating electric field concentration near the boundary of the active region 101 and the edge termination structure portion 102. In particular, the p$^-$-type region 5a is provided so as to be exposed at the base front surface in the flat portion 104, to contact the outermost p$^+$-type base region 3, and to surround a periphery of this p$^+$-type base region 3. Further, the p$^-$-type region 5a extends from the flat portion 104 toward the inner side, for example, to the step portion 103, covering the entire lower side (drain side) of the portion of the outermost p$^+$-type base region 3 extending into the flat portion 104. The p$^{---}$-type region 5b is provided farther on the outer side than the p$^-$-type region 5a is, contacts the p$^-$-type region 5a, and surrounds a periphery of the p$^-$-type region 5a.

In other words, the p$^-$-type region 5a and the p$^{---}$-type region 5b are provided in a concentric shape surrounding the periphery of the active region 101 and constitute a double zone junction termination extension (JTE) structure. The interface of the n-type drift layer 2 with the p$^-$-type region 5a and the p$^{---}$-type region 5b is positioned farther on the drain side than the interface of the p$^+$-type base region 3 and the n-type drift layer 2 is. In other words, the p$^-$-type region 5a and the p$^{---}$-type region 5b have a thickness (a depth from the base front surface) that is thicker than a thickness of the p$^+$-type base region 3 in the flat portion 104. The base front surface in the edge termination structure portion 102 (including the step portion 103 and the flat portion 104) is covered by the interlayer insulating film 11 (or an insulating layer in which the gate insulating film 9 and the interlayer insulating film 11 are sequentially stacked). The p$^-$-type region 5a and the p$^{---}$-type region 5b are electrically insulated from the unit cells of the active region 101 by the interlayer insulating film 11.

In place of the double zone JTE structure, the edge termination structure arranged in the edge termination structure portion 102 may be another edge termination structure for mitigating electric field concentration such as a multizone JTE structure, a field limiting ring (FLR) structure, or the like. A multizone JTE structure is an edge termination structure in which 3 or more p-type regions of differing impurity concentrations are arranged in a concentric shape surrounding the periphery of the active region 101 and the impurity concentrations of the p-type regions are progressively lower the farther on the outer side the p-type region is arranged. A FLR structure is an edge termination structure in which multiple p-type regions are arranged at predetermined intervals in a concentric shape surrounding the periphery of the active region 101 and is applicable irrespective of the difficulty of manufacturing. On a rear surface of the silicon carbide semiconductor base (rear surface of the n$^+$-type silicon carbide substrate 1), a rear electrode (second electrode) 15 is provided that is a drain electrode and extends from the active region 101 across the edge termination structure portion 102. A rear electrode pad 16 is provided on a surface of the rear electrode 15.

In the invention above, without limitation to the embodiments described, various modifications are possible within a scope not deviating from the spirit of the invention. For example, in the described embodiments, dimensions, impurity concentrations, etc. of regions may be suitably set according to required specifications. Further, in the described embodiments, although case in which a main surface (front surface) of the silicon carbide substrate is a (000-1)-face 4 degrees off toward <11-20> has been described as an example, without limitation hereto, the plane orientation of the main surface of the silicon carbide substrate may be variously modified according to design specifications and the like. Further, the present invention achieves similar effects, even when applied to a MOSFET having a trench gate structure. In this case, for example, a trench that penetrates the n$^+$-type source region, the p-type silicon carbide epitaxial layer forming the p-type base layer, and the p$^+$-type base region is formed, reaching a portion other than the p$^+$-type base region of the n-type silicon carbide epitaxial layer forming the n-type drift layer, and in this trench, a gate electrode is provided via a gate insulating film.

In the embodiments above, although a MOSFET has been described as an example, the present invention is applicable to MOS-type semiconductor devices such as IGBT having a MOS gate structure on the base front surface side. Further, in the embodiments above, although a case where a silicon carbide semiconductor is used has been described as an example, without limitation hereto, even when another wide bandgap semiconductor such as gallium nitride (GaN), diamond, or the like, or a silicon (Si) semiconductor is used, similar effects are obtained. Further, in the embodiments above, although a first conductivity type is assumed to be an n-type and a second conductivity type is assumed to be a p-type, the present invention is similarly implemented when the first conductivity type is a p-type and the second conductivity type is an n-type.

However, in Japanese Laid-Open Patent Publication No. 2006-147789, portions (i.e., the edge termination structure portion) other than the active region of the epitaxial layer that includes the portion that becomes a channel are unnecessary portions and have to be removed. Therefore, a problem arises in that the breakdown voltage decreases consequent to adverse effects of variations from etching for removing the epitaxial layer and from the shape of the step portion occurring near the boundary of the active region and the edge termination structure portion, etc. In Japanese Laid-Open Patent Publication No. 2010-045388, since the p-type region is provided at the step portion, decreases in the breakdown voltage consequent to the concentration of electric field at the step portion may be prevented, however, the portion where the electric field concentrates moves from the step portion to a vicinity of the active region and thus, reliability may decrease.

According to the present invention, when high voltage is applied to the second electrode, electric field may be caused to concentrate at the outer circumferential end portion of the outermost first semiconductor region or at the second semiconductor region constituting the edge termination structure. Therefore, even for a configuration in which a base region is formed in the active region by a second semiconductor layer having a low impurity concentration and formed by epitaxial growth and the ON resistance is lowered, the concentration of electric field at the step portion occurring with the formation of the second semiconductor layer may be prevented. As a result, reduction of the breakdown voltage may be prevented.

The semiconductor device of the present invention enables breakdown voltage to be improved and high voltage to be maintained.

As described, the semiconductor device according to the present invention is useful for high-voltage semiconductor devices used in power converting equipment and power supply devices such as in various industrial machines, and is particularly suitable for semiconductor devices that use a wide bandgap semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region through which current flows and an edge termination structure region in which a structure for reducing concentration of electric field is formed, the edge termination structure region being arranged outside of the active region, the semiconductor device comprising:
   a semiconductor substrate of a first conductivity type, having an upper surface and a lower surface;
   a first semiconductor layer of the first conductivity type, provided on the upper surface of the semiconductor substrate, the first semiconductor layer having an impurity concentration lower than that of the semiconductor substrate, a lower surface of the first semiconductor layer facing the upper surface of the semiconductor substrate;
   a first semiconductor region of a second conductivity type, selectively provided in an upper surface of the first semiconductor layer, and extending from within the active region to within the edge termination structure region;
   a second semiconductor layer of the second conductivity type, having an impurity concentration lower than that of the first semiconductor region, and being provided on the upper surface of the first semiconductor layer, so as to cover the first semiconductor region; and
   a second semiconductor region of the second conductivity type, having an impurity concentration lower than that of the first semiconductor region, constituting an edge termination structure, and being selectively provided, in the upper surface of the first semiconductor layer, farther outside of the active region than the first semiconductor region;
   a step portion in a first area of the edge termination structure region between the second semiconductor layer and the first semiconductor layer;
   a flat portion, in which the upper surface of the first semiconductor layer is exposed, disposed in a second area of the edge termination structure region farther outside of the active region than the first area, a portion of the first semiconductor region that is outermost relative to the active region, extending within the flat portion, the second semiconductor region being provided in the flat portion and entirely covering the outermost portion of the first semiconductor region.

2. The semiconductor device according to claim 1, wherein the second semiconductor region overlaps both said portion of the first semiconductor region and the step portion.

3. The semiconductor device according to claim 2, wherein the second semiconductor region extends to the second semiconductor layer so as to overlap an outer circumferential portion of the second semiconductor layer.

4. The semiconductor device according to claim 1, further comprising:
   a third semiconductor region of the first conductivity type, selectively provided in the second semiconductor layer;
   a fourth semiconductor region of the first conductivity type, provided away from the third semiconductor region, penetrating the second semiconductor layer in a depth direction, and reaching the first semiconductor layer;
   a gate insulating film on the second semiconductor layer;
   a gate electrode in a region of the gate insulating film between the third semiconductor region and the fourth semiconductor region;
   a first electrode contacting the second semiconductor layer and the third semiconductor region; and
   a second electrode on the lower surface of the semiconductor substrate.

5. The semiconductor device according to claim 4, further comprising
   a fifth semiconductor region of the second conductivity type, selectively provided in the second semiconductor layer, a portion of the fifth semiconductor region that is outermost relative to the active region extending to the second semiconductor region, thereby contacting the second semiconductor region.

6. The semiconductor device according to claim 4, further comprising
   a fifth semiconductor region of the second conductivity type, selectively provided in the second semiconductor layer, a portion of the fifth semiconductor region that is outermost relative to the active region, overlapping an inner circumferential portion of the second semiconductor region, thereby contacting the second semiconductor region.

7. The semiconductor device according to claim 1, further comprising:
   a third semiconductor region of the first conductivity type, selectively provided in the second semiconductor layer;
   a trench penetrating the third semiconductor region, the second semiconductor layer, and at least a portion of the first semiconductor region to reach the first semiconductor layer;
   a gate insulating film inside the trench;
   a gate electrode on the gate insulating film inside the trench;
   a first electrode contacting the second semiconductor layer and the third semiconductor region; and
   a second electrode on the lower surface of the semiconductor substrate.

8. The semiconductor device according to claim 1, wherein an upper surface of the second semiconductor region is positioned closer in a depth direction to the semiconductor substrate than an upper surface of the second semiconductor layer.

9. The semiconductor device according to claim 1, wherein an interface between the second semiconductor region and the first semiconductor layer is positioned closer in a depth direction to the semiconductor substrate than an interface between the first semiconductor region and the first semiconductor layer.

10. A semiconductor device having an active region through which current flows and an edge termination structure region in which a structure for reducing concentration of electric field is formed, the edge termination structure region being arranged outside of the active region, the semiconductor device comprising:
   a semiconductor substrate of a first conductivity type, having an upper surface and a lower surface;
   a first semiconductor layer of the first conductivity type, provided on the upper surface of the semiconductor substrate, and having an impurity concentration lower than that of the semiconductor substrate;
   a first semiconductor region of a second conductivity type, selectively provided in an upper surface of the first semiconductor layer, and extending from within the active region to within the edge termination structure region;
   a second semiconductor layer of the second conductivity type, having an impurity concentration lower than that of the first semiconductor region, and being provided on the upper surface of the first semiconductor layer, so as to cover the first semiconductor region;
   a second semiconductor region of the second conductivity type, having an impurity concentration lower than that of the first semiconductor region, constituting an edge termination structure, and being selectively provided farther outside of the active region than the first semiconductor region, in the upper surface of the first semiconductor layer;
   a third semiconductor region of the first conductivity type, selectively provided in the second semiconductor layer;
   a fifth semiconductor region of the second conductivity type, selectively provided in the second semiconductor layer;
   a gate insulating film contacting a region of the second semiconductor layer between the third semiconductor region and the first semiconductor layer;
   a gate electrode sandwiching the gate insulating film with the second semiconductor layer;
   a first electrode contacting the second semiconductor layer and the third semiconductor region;
   a second electrode on the lower surface of the semiconductor substrate;
   a step portion in a first area of the edge termination structure region between the second semiconductor layer and the first semiconductor layer; and
   a flat portion, in which the upper surface of the first semiconductor layer is exposed, disposed in a second area of the edge termination structure region farther outside of the active region than the first area, a portion of the first semiconductor region that is outermost relative to the active region, extending from the active region into the flat portion, a portion of the fifth semiconductor region that is outermost relative to the active region, extending within the flat portion and entirely covering an area of the flat portion in which the first semiconductor region extends.

11. The semiconductor device according to claim 10, wherein an upper surface of the second semiconductor region is positioned closer in a depth direction to the semiconductor substrate than an upper surface of the second semiconductor layer.

12. The semiconductor device according to claim 10, wherein an interface between the second semiconductor region and the first semiconductor layer is positioned closer in a depth direction to the semiconductor substrate than an interface between the first semiconductor region and the first semiconductor layer.

* * * * *